(12) United States Patent
Tanahashi et al.

(10) Patent No.: US 11,757,258 B2
(45) Date of Patent: Sep. 12, 2023

(54) LIGHT SOURCE DEVICE AND DIRECT DIODE LASER SYSTEM

(71) Applicant: NICHIA CORPORATION, Anan (JP)

(72) Inventors: Yasuo Tanahashi, Yokohama (JP); Masaki Omori, Toshima-ku (JP)

(73) Assignee: NICHIA CORPORATION, Anan (JP)

( * ) Notice: Subject to any disclaimer, the term of this patent is extended or adjusted under 35 U.S.C. 154(b) by 296 days.

(21) Appl. No.: 17/182,742

(22) Filed: Feb. 23, 2021

(65) Prior Publication Data

US 2021/0265821 A1 Aug. 26, 2021

(30) Foreign Application Priority Data

Feb. 25, 2020 (JP) ................................. 2020-029129

(51) Int. Cl.
| | |
|---|---|
| *H01S 5/00* | (2006.01) |
| *H01S 5/40* | (2006.01) |
| *H01S 5/14* | (2006.01) |
| *H01S 5/02251* | (2021.01) |
| *H01S 5/02212* | (2021.01) |

(52) U.S. Cl.
CPC ........ *H01S 5/4012* (2013.01); *H01S 5/02251* (2021.01); *H01S 5/141* (2013.01); *H01S 5/4062* (2013.01); *H01S 5/4087* (2013.01); *H01S 5/005* (2013.01); *H01S 5/02212* (2013.01)

(58) Field of Classification Search
CPC .... H01S 5/4012; H01S 5/02251; H01S 5/141; H01S 5/4062; H01S 5/4087; H01S 5/005; H01S 5/02212
See application file for complete search history.

(56) References Cited

U.S. PATENT DOCUMENTS

| | | | | |
|---|---|---|---|---|
| 6,192,062 | B1 * | 2/2001 | Sanchez-Rubio | ..... H01S 5/4062 372/98 |
| 9,093,822 | B1 * | 7/2015 | Chann | ................... H01S 5/4062 |
| 2003/0002143 | A1 | 1/2003 | Inoue et al. | |
| 2007/0002925 | A1 * | 1/2007 | Zediker | ................. H01S 5/4062 372/98 |
| 2007/0116076 | A1 * | 5/2007 | Wang | ................... H04B 10/564 372/38.07 |
| 2010/0238099 | A1 | 9/2010 | Sumiyama | |

(Continued)

FOREIGN PATENT DOCUMENTS

| | | |
|---|---|---|
| JP | 2003-086871 A | 3/2003 |
| JP | 2010-244021 A | 10/2010 |

(Continued)

*Primary Examiner* — Kinam Park
(74) *Attorney, Agent, or Firm* — Foley & Lardner LLP

(57) ABSTRACT

A light source device including: a first light source configured to coaxially combine a plurality of first laser beams, each having a peak wavelength within a first wavelength range, to thereby generate and emit a first wavelength-combined beam; a second light source configured to coaxially combine a plurality of second laser beams, each having a peak wavelength within a second wavelength range that defines a range of peak wavelengths shorter than the peak wavelengths in the first wavelength range, to thereby generate and emit a second wavelength-combined beam; and a wavelength filter configured to coaxially combine the first wavelength-combined beam and the second wavelength-combined beam to thereby generate and emit a third wavelength-combined beam.

10 Claims, 19 Drawing Sheets

(56) References Cited

U.S. PATENT DOCUMENTS

| | | |
|---|---|---|
| 2011/0285967 A1 | 11/2011 | Gollier |
| 2011/0317130 A1 | 12/2011 | Gollier |
| 2014/0268352 A1* | 9/2014 | Vethake ............ G02B 27/0905 |
| | | 359/618 |
| 2016/0161752 A1* | 6/2016 | Negoita ................ H01S 5/4062 |
| | | 359/569 |
| 2019/0020178 A1 | 1/2019 | Oguri et al. |
| 2019/0305517 A1 | 10/2019 | Dejima et al. |
| 2019/0366477 A1 | 12/2019 | Morita et al. |
| 2019/0372311 A1 | 12/2019 | Dejima |

FOREIGN PATENT DOCUMENTS

| | | |
|---|---|---|
| JP | 2013-533502 A | 8/2013 |
| JP | 2013-538362 A | 10/2013 |
| JP | 2013-251401 A | 12/2013 |
| JP | 2016-073983 A | 5/2016 |
| JP | 2016-082219 A | 5/2016 |
| JP | 2017-204530 A | 11/2017 |
| JP | 2019-175974 A | 10/2019 |
| JP | 2019-192756 A | 10/2019 |
| JP | 2019-212654 A | 12/2019 |
| JP | 2020-068312 A | 4/2020 |
| WO | WO-2014/076445 A1 | 5/2014 |
| WO | WO-2017/134911 A1 | 8/2017 |
| WO | WO-2018/173101 A1 | 9/2018 |
| WO | WO-2018/173109 A1 | 9/2018 |

* cited by examiner

LIGHT SOURCE DEVICE AND DIRECT DIODE LASER SYSTEM

CROSS-REFERENCE TO RELATED APPLICATION

This application claims priority to Japanese Patent Application No. 2020-029129, filed on Feb. 25, 2020, the entire contents of which are hereby incorporated by reference.

BACKGROUND

The present application relates to a light source device and a direct diode laser system.

High-power and high-beam quality laser beams are used for performing processing such as cutting, punching, or marking for various kinds of materials, or welding a metal material. Some of the carbon dioxide gas laser apparatuses and YAG solid laser apparatuses that have been used for such laser processing are being replaced by fiber laser apparatuses, which have a high efficiency of energy conversion. Laser diodes (hereinafter simply referred to as LD) are used as pumping light sources of fiber lasers. According to increase in output of LDs in the recent years, techniques using LDs as light sources of a laser beam directly irradiating a material to process the material, instead of using LDs as pumping light sources, have been developed. Such techniques are referred to as "direct diode laser (DDL) technology".

U.S. Pat. No. 6,192,062 describes an example of a light source device configured to combine a plurality of laser beams of respectively different wavelengths, which have been emitted from a plurality of LDs, to increase the optical output power. Coaxially combining a plurality of laser beams of respective wavelengths, referred to as "wavelength beam combining (WBC)" or "spectral beam combining (SBC)", can be used in enhancing the optical output power and luminance of a DDL system or the like, for example.

A light source device and a direct diode laser system are desired which can provide an enhanced output.

SUMMARY

A light source device according to an illustrative embodiment of the present disclosure includes: a first light source, a second light source, and a wavelength filter. The first light source is configured to coaxially combine a plurality of first laser beams to generate and emit a first wavelength-combined beam. Each of the plurality of first laser beams has a peak wavelength within a first wavelength range. The second light source is configured to coaxially combine a plurality of second laser beams to generate and emit a second wavelength-combined beam. Each of the plurality of second laser beams has a peak wavelength within a second wavelength range that defines a range of the peak wavelengths shorter than the peak wavelengths in the first wavelength range. The wavelength filter is configured to coaxially combine the first wavelength-combined beam and the second wavelength-combined beam to generate and emit a third wavelength-combined beam.

A direct diode laser system according to an illustrative embodiment of the present disclosure includes: the above light source device; an optical fiber to which the third wavelength-combined beam emitted from the light source device is combined; and a processing head connected to the optical fiber. The processing head is configured to irradiate a target object with the third wavelength-combined beam emitted from the optical fiber.

According to an embodiment of the present disclosure, a light source device and a direct diode laser system that can provide an enhanced output can be provided.

DETAILED DESCRIPTION

Figure 1:
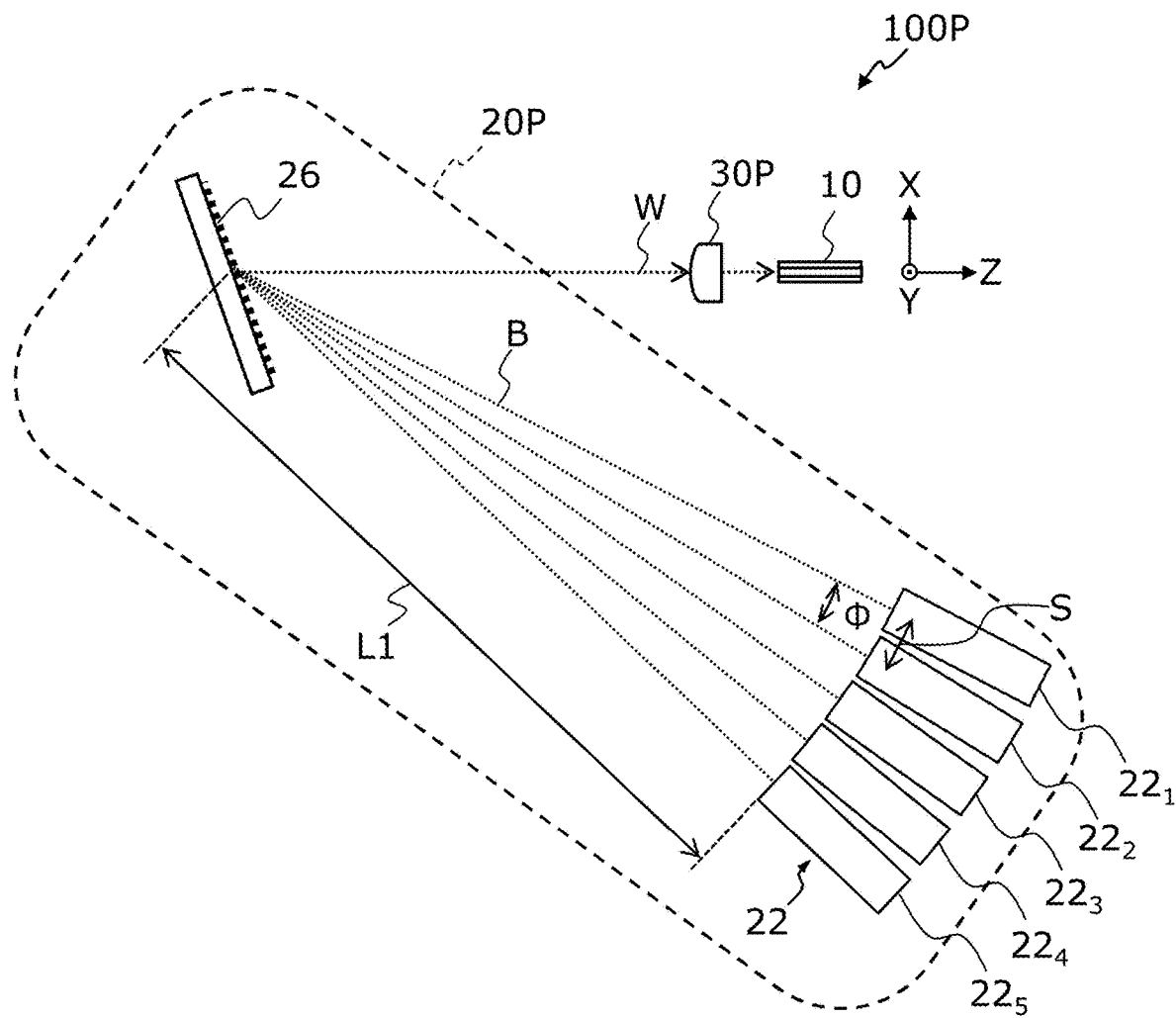
FIG. 1 is a diagram showing an example structure of a light source device in which laser beams that have been combined through wavelength beam combining are focused onto an optical fiber.

Prior to describing an embodiment of the present disclosure, an example of a basic structure of a light source device configured to perform "wavelength beam combining (WBC)" will be described. FIG. 1 is a diagram showing an example structure of a light source device in which laser beams that have been combined through WBC are focused onto an optical fiber. For reference, an XYZ coordinate system that includes an X axis, a Y axis, and a Z axis, which are orthogonal to one another, is schematically shown in the drawings, including FIG. 1. In the example of FIG. 1, the Y axis is the viewing direction of FIG. 1, and FIG. 1 schematically shows a view parallel to the XZ plane of the light source device 100P. The propagation direction of the wavelength-combined beam W is parallel to the Z axis direction.

The light source device 100P shown in FIG. 1 includes an optical fiber 10, a beam light source 20P, and an optical coupling device 30P. The beam light source 20P coaxially combines a plurality of laser beams B of different peak wavelengths $\lambda$ to generate and emit a wavelength-combined beam W. In the present disclosure, the term "wavelength-combined beam" refers to a laser beam in which a plurality of laser beams B of different peak wavelengths $\lambda$ are coaxially combined through WBC. With the WBC technique, n laser beams of different peak wavelengths $\lambda$ are coaxially combined, so that not only the optical output power but also the fluence (unit: $W/cm^2$) can be increased to about n times the fluence of each individual laser beam B.

In the example shown in FIG. 1, the beam light source 20P includes a plurality of laser modules 22 configured to emit a plurality of laser beams B of different peak wavelengths A, and a beam combiner 26 configured to combine the plurality of laser beams B to generate a wavelength-combined beam W. FIG. 1 illustrates five laser modules $22_1$ to $22_5$.

In the example shown in FIG. 1, the beam combiner 26 is a reflection-type diffraction grating. Components other than a diffraction grating can be employed for the beam combiner 26, and the beam combiner 26 can also be another wavelength-dispersion optical element, for example, a prism. The laser beams B are incident on the reflection-type diffraction grating at different angles, and all of minus-first order reflection-diffracted light of the laser beams B are emitted in the same direction. In FIG. 1, for simplicity, the center axis of each laser beam B and the center axis of the wavelength-combined beam W are illustrated to indicate each laser beam B and the wavelength-combined beam W. The wavelength-combined beam W emitted from the beam light source 20P is focused by the optical coupling device 30P, so as to be incident on the core of the optical fiber 10.

As used herein, the distance from each laser module 22 to the reflection-type diffraction grating (beam combiner 26) is indicated by L1, and the angle between two adjacent laser modules 22, i.e., the angle between two adjacent laser beams B, is indicated by $\Phi$ (radian: rad). In the example shown in FIG. 1, the distance L1 and the angle $\Phi$ are uniform among the laser modules $22_1$ to $22_5$. Assuming that the arrangement pitch (intervals between emitters) of the laser modules 22 is S, an approximate expression $\Phi \times L1 = S$ holds true.

Figure 2:
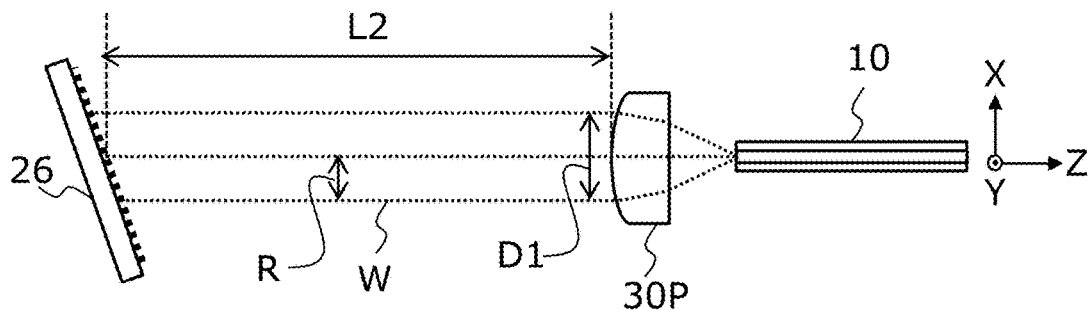
FIG. 2 is a diagram schematically showing focusing of a wavelength-combined beam W onto an optical fiber 10 by an optical coupling device 30P.

FIG. 2 is a diagram schematically showing how a wavelength-combined beam W emitted from the beam combiner 26 can be focused by the optical coupling device 30P onto the optical fiber 10. An example of the optical coupling device 30P is a converging lens. For simplicity, the wavelength-combined beam W is schematically represented by three rays. Among the three rays, the middle ray is on the optical axis of the lens, while the other two rays schematically represent positions that would together define the beam diameter. The beam diameter can be defined by the size of a region having an optical intensity of, e.g., $1/e^2$ or more relative to the optical intensity in the beam center. Herein, e is Napier's constant (about 2.71). The beam diameter or beam radius can be defined by other definitions.

In FIG. 2, the wavelength-combined beam W is illustrated as a parallel collimated beam, and a diameter (incident beam diameter) of the wavelength-combined beam W along the X axis direction in a region incident on the optical coupling device 30P is denoted as D1. In actuality, however, the wavelength-combined beam W propagating along the Z axis direction is not perfectly parallel light; the beam radius R of the wavelength-combined beam W is not uniform, but rather is a function of position on the optical path (i.e., the coordinate value z on the Z axis) or optical path length. Moreover, the size of the beam radius R of the wavelength-combined beam W can be varied in the Y axis direction and the X axis direction. Therefore, in a strict sense, it would be appropriate to denote its beam radius along the Y axis direction as $R_Y(z)$ and its beam radius along the X axis direction as $R_X(z)$. Because the wavelength-combined beam W results from coaxial and spatial overlapping of the individual laser beams B, the beam radius R and the divergence half angle $\theta$ of the wavelength-combined beam W can be approximated as the beam radius w and the divergence half angle θ, respectively, of the individual laser beam B emitted from each laser module 22.

In FIG. 2, the distance from the reflection-type diffraction grating (beam combiner 26) to the optical coupling device 30P is denoted as L2. The distance L2 can be set in a range of 100 mm to 500 mm, for example. Moreover, the distance L1 shown in FIG. 1 is, e.g., about 2000 mm or more. The angle Φ and pitch S that define this distance L1 are restricted by the wavelength of the laser beam B, the structure and performance of the beam combiner 26, structure and size of each laser module 22, etc., and are difficult to be reduced to a great extent. Hereinafter, L1+L2 may be referred to as the "optical path length".

Through studies by the inventors, the aforementioned example structure has been found to possess the following problems.

As the number of laser modules 22 is increased for an enhanced optical output power of the wavelength-combined beam W, the range of incident angles of the plurality of laser beams B incident upon the beam combiner 26 enlarges. As is clear from FIG. 1, this range of incident angles spans Φ×(number of laser modules 22−1). The diffraction efficiency of the beam combiner 26 will decrease if the incident angle of any laser beam B deviates from a predetermined range. Therefore, as the number of laser modules 22 is increased, the optical intensity of each laser beam B that is diffracted by the beam combiner 26 may decrease or the beam quality may be degraded. This poses a limit, e.g., about 12, to the number of laser modules 22 that can be employed for wavelength beam combining in the example structure shown in FIG. 1. Increasing the number of laser modules 22 beyond this limit may result in a decrease in beam quality. Embodiments of the present disclosure can address with such a disadvantage.

Embodiments

<Light Source Device>

Figure 3:
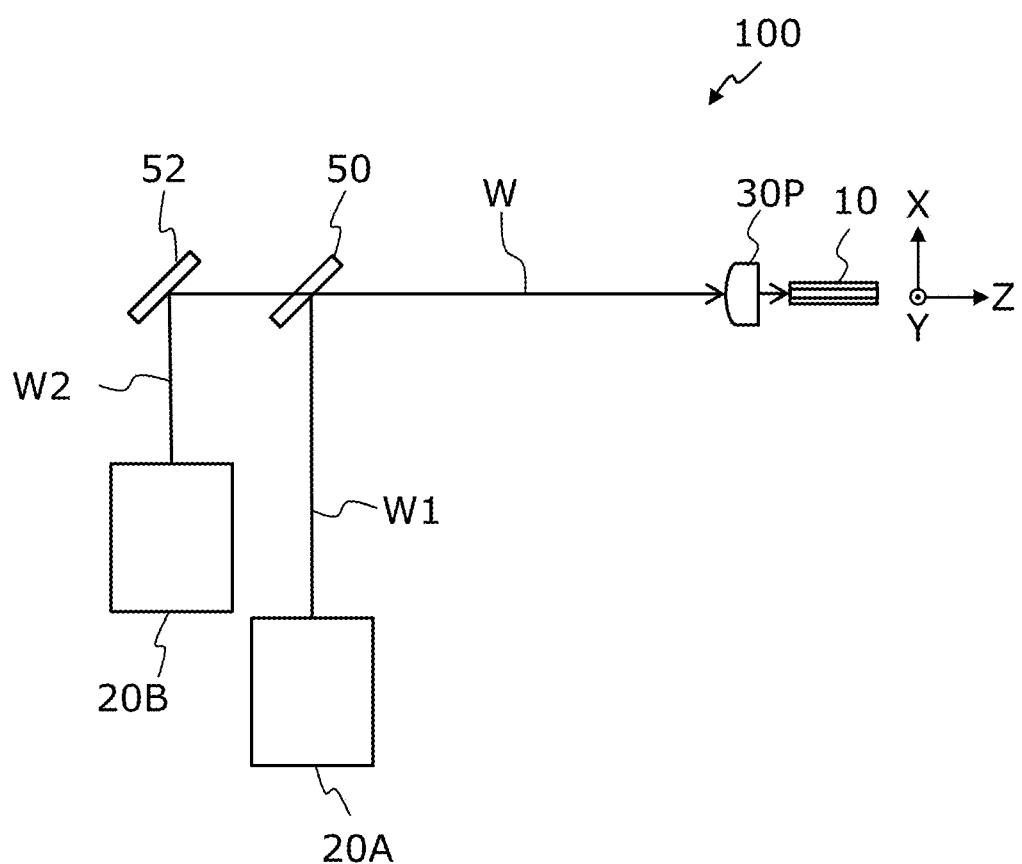
FIG. 3 is a diagram showing an example structure of a light source device according to an embodiment of the present disclosure.

FIG. 3 is a diagram showing an example structure of the light source device 100 according to an embodiment of the present disclosure. The light source device 100 shown in FIG. 3 includes a first light source 20A and a second light source 20B. The schematic structure of each of the first light source 20A and the second light source 20B can be similar to that of the beam light source 20P in FIG. 1. Details of the structure of the first light source 20A and the second light source 20B will be described later.

Figure 4:
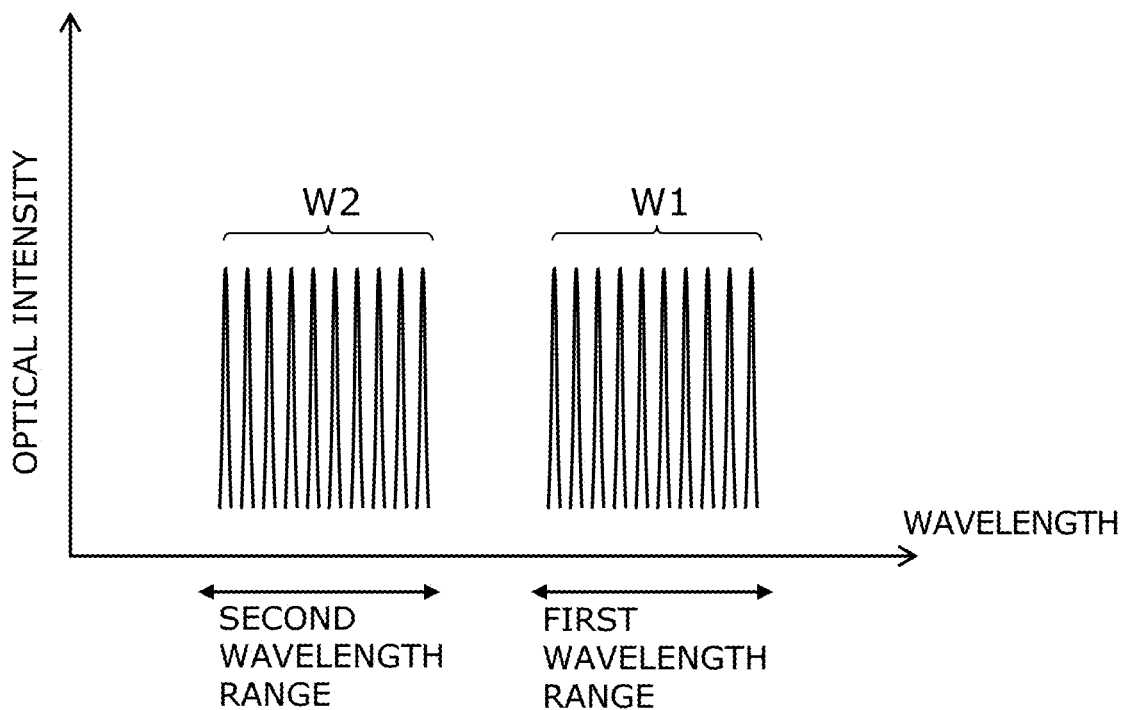
FIG. 4 is a diagram showing a relationship between a first wavelength range and a second wavelength range.

The first light source 20A coaxially combines a plurality of first laser beams to generate and emit a first wavelength-combined beam W1. The peak wavelength of each of the plurality of first laser beams is within a first wavelength range. The second light source 20B coaxially combines a plurality of second laser beams to generate and emit a second wavelength-combined beam W2. The peak wavelength of each of the plurality of second laser beams is within a second wavelength range, the second wavelength range defining a range of wavelengths shorter than the wavelengths in the first wavelength range. This relationship is schematically shown in FIG. 4. In the example of FIG. 4, peak wavelengths of respective ones of the plurality of first laser beams composing the first wavelength-combined beam W1 differ from one another, while remaining within the first wavelength range. Similarly, peak wavelengths of respective ones of the plurality of second laser beams composing the second wavelength-combined beam W2 differ from one another, while remaining within the second wavelength range. The example of FIG. 4 illustrates that ten peak wavelengths are included in each of the first wavelength range and the second wavelength range, embodiments of the present disclosure are not limited to this example.

In the example of FIG. 3, the light source device 100 includes: a wavelength filter 50 configured to coaxially combine the first wavelength-combined beam W1 and the second wavelength-combined beam W2 to generate and emit a third wavelength-combined beam W3; and a mirror 52 that reflects the second wavelength-combined beam W2. The wavelength filter 50 cam comprise a dielectric multilayer film configured to transmit the wavelength-combined beam W2 having a wavelength less than about 425 nm and to reflect the wavelength-combined beam W1 having a wavelength greater than about 425 nm, for example. The wavelength-combined beam W2 having been reflected by the mirror 52 is transmitted through the wavelength filter 50, and becomes combined with the wavelength-combined beam W1 having been reflected by the wavelength filter 50.

Figure 5:
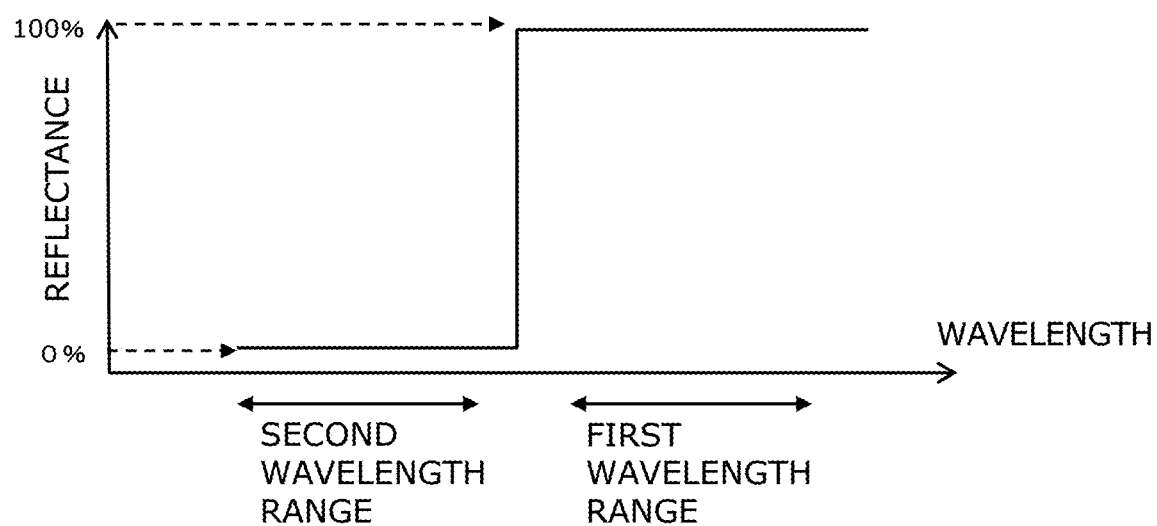
FIG. 5 is a graph illustrating an example of wavelength dependence of reflectance of the wavelength filter.

Examples of the wavelength filter 50 include dichroic mirrors, diffractive optical elements, holographic optical elements, and the like; preferably, the wavelength filter 50 is a dichroic mirror. FIG. 5 is a graph schematically showing an example of wavelength dependence of reflectance of the wavelength filter 50. A film having wavelength selectivity (e.g., a dielectric multilayer film) is deposited on the wavelength filter 50. Thus, given a laser beam having a peak wavelength in the first wavelength range and a laser beam having a peak wavelength in the second wavelength range, the wavelength filter 50 is able to transmit one and reflect the other of the two laser beams. The example of FIG. 5 illustrates an example of reflectance characteristics such that the reflectance changes from about 0% to about 100% at a reference value that exists between the first wavelength range and the second wavelength range. For example, the first wavelength-combined beam W1 may be a beam of light into which laser beams having eleven different peak wavelengths belonging in the range of 430 nm to 450 nm are combined. The second wavelength-combined beam W2 may be a beam of light into which laser beams having eleven different peak wavelengths belonging in the range of 400 nm to 420 nm are combined.

In the light source device 100 of this example, optical path lengths from the two beam light sources 20P1 and 20P2 to the optical coupling device 30P are equal to each other.

According to the present embodiment, even if the number of laser modules 22 such as those illustrated in FIG. 1 is increased to enhance optical output power of the wavelength-combined beam W, the range of incident angles of the plurality of laser beams incident on the beam combiner 26 can still be suppressed from becoming larger. Therefore, while suppressing a decrease in beam quality, the number of laser modules that can be used for wavelength beam combining can be increased to twenty or more, for example.

Figure 6:
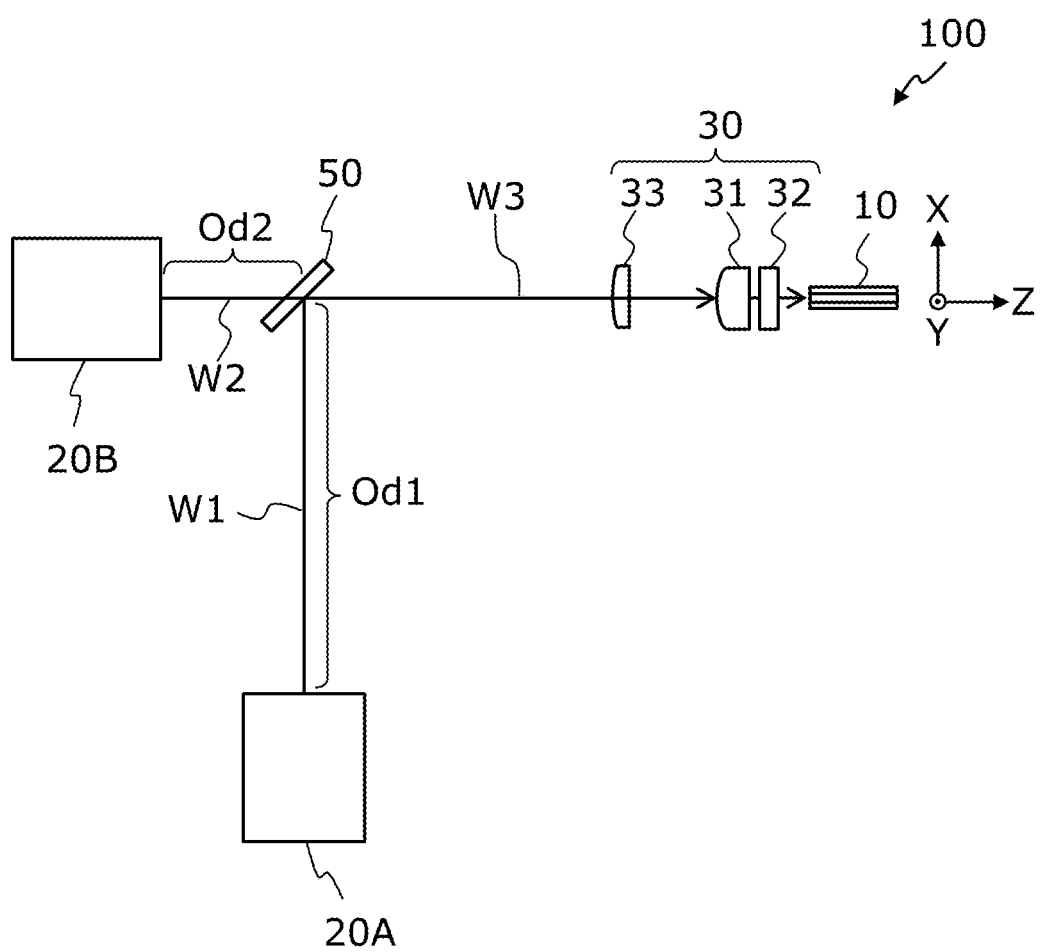
FIG. 6 is a diagram showing another example structure of the light source device according to an embodiment of the present disclosure.

FIG. 6 is a diagram showing another example structure of the light source device 100 according to an embodiment of the present disclosure.

In the embodiment shown in FIG. 6, a first optical path length Od1 between the first light source 20A and the wavelength filter 50 is longer than a second optical path length Od2 between the second light source 20B and the wavelength filter 50. For example, the difference between the first optical path length Od1 and the second optical path length Od2 can be 250 mm or more. In the case in which the relationship Od1>Od2 is satisfied, the beam quality can be improved for the reasons that will be described later.

The light source device 100 in the example of FIG. 6 includes an optical coupling device 30 configured to focus the third wavelength-combined beam W3 emitted from the wavelength filter 50 and couples it to the optical fiber 10. Details of the optical coupling device 30 will also be described later.

Figure 7:
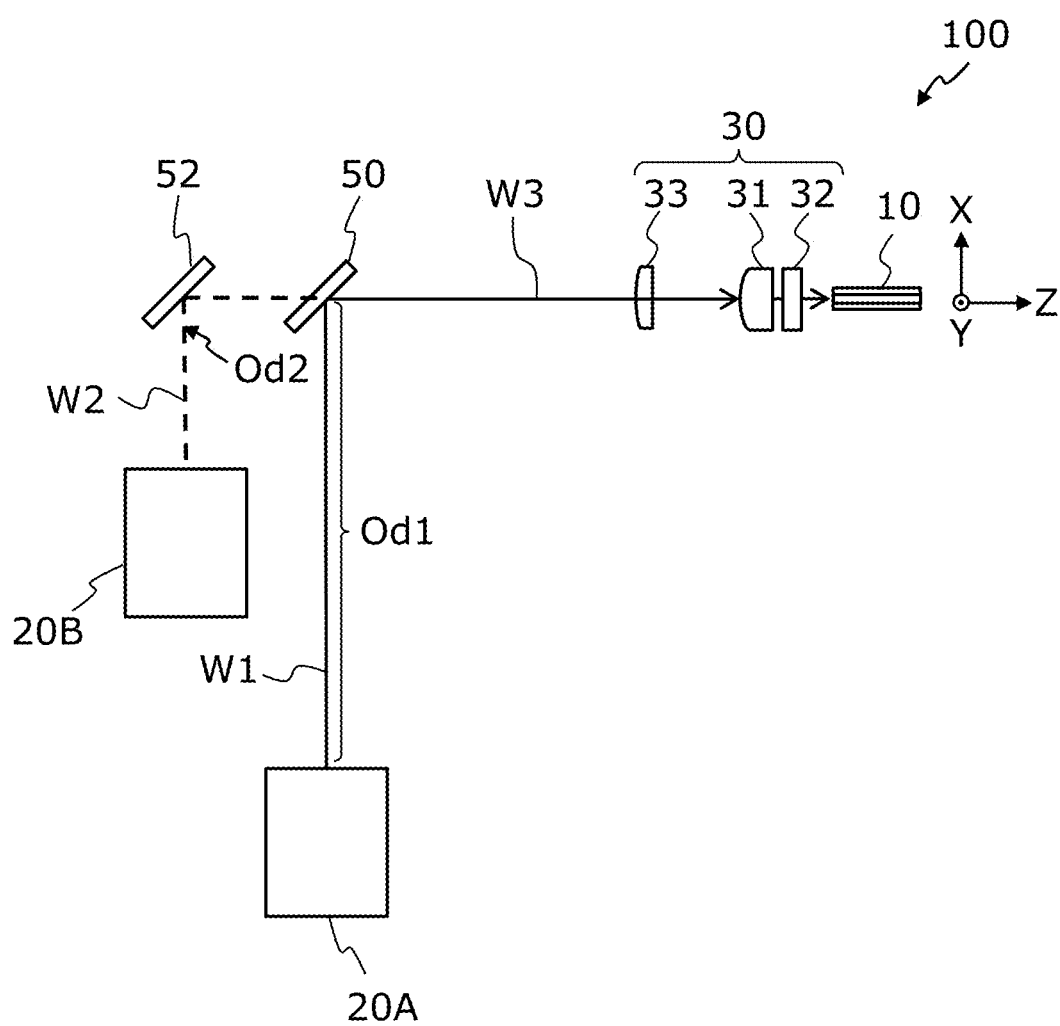
FIG. 7 is a diagram showing still another example structure of the light source device according to an embodiment of the present disclosure.

FIG. 7 is a diagram schematically showing still another example structure satisfying the relationship Od1>Od2. The light source device 100 of this example includes a mirror 52 that reflects the second wavelength-combined beam W2 emitted from the second light source 20B so as to be incident on the wavelength filter 50. The position and orientation of the mirror 52 are adjusted so that the second wavelength-combined beam W2 reflected from the mirror 52 is coaxially combined with the first wavelength-combined beam W1 reflected from the wavelength filter 50. In the example of FIG. 7, the mirror 52 causes the direction of travel of the second wavelength-combined beam W2 to rotate by 90 degrees on the optical path having the second optical path length Od2. The direction of travel of the second wavelength-combined beam W2 emitted from the second light source 20B does not need to be parallel to the direction of travel of the first wavelength-combined beam W1 emitted from the first light source 20A. In the case in which these directions are not parallel, the mirror 52 and the wavelength filter 50 can have different angles of reflection from each other.

Figure 8:
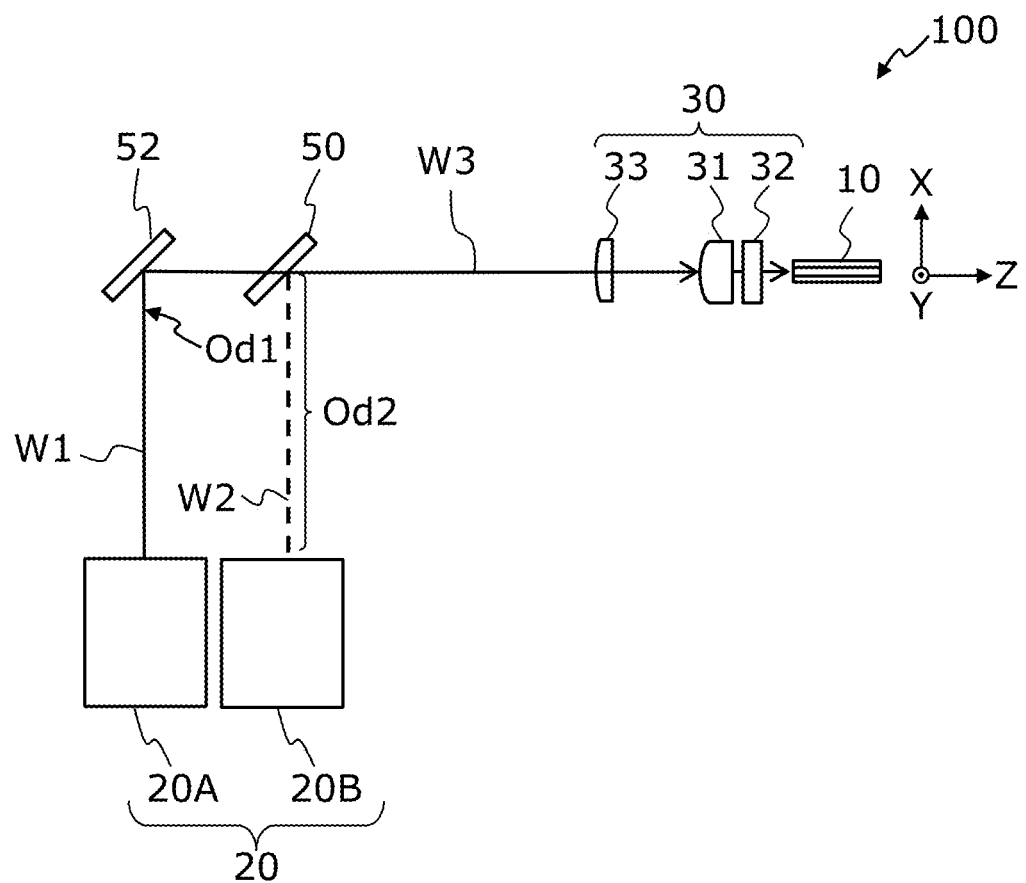
FIG. 8 is a diagram showing still another example structure of the light source device according to an embodiment of the present disclosure.
Figure 9:
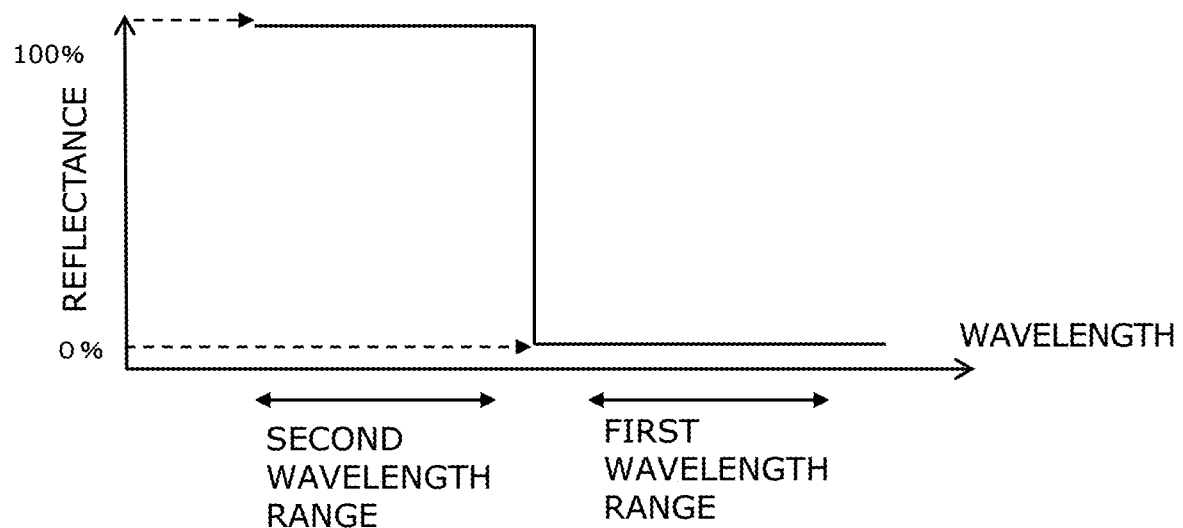
FIG. 9 is a graph illustrating another example of wavelength dependence of reflectance of the wavelength filter.

FIG. 8 is a diagram schematically showing still another example structure satisfying the relationship Od1>Od2. The light source device 100 of this example includes a wavelength filter 50 having reflectance characteristics as shown in FIG. 9. The wavelength filter 50 having wavelength selectivity as shown in FIG. 9 can transmit a laser beam having a peak wavelength in the first wavelength range, and reflect a laser beam having a peak wavelength in the second wavelength range. In the light source device 100, the mirror 52 reflects the first wavelength-combined beam W1 emitted from the first light source 20A so that the first wavelength-combined beam W1 is incident on the wavelength filter 50. The position and orientation of the mirror 52 is adjusted so that the first wavelength-combined beam W1 reflected from the mirror 52 is coaxially combined with the second wavelength-combined beam W2 reflected from the wavelength filter 50.

Figure 10A:
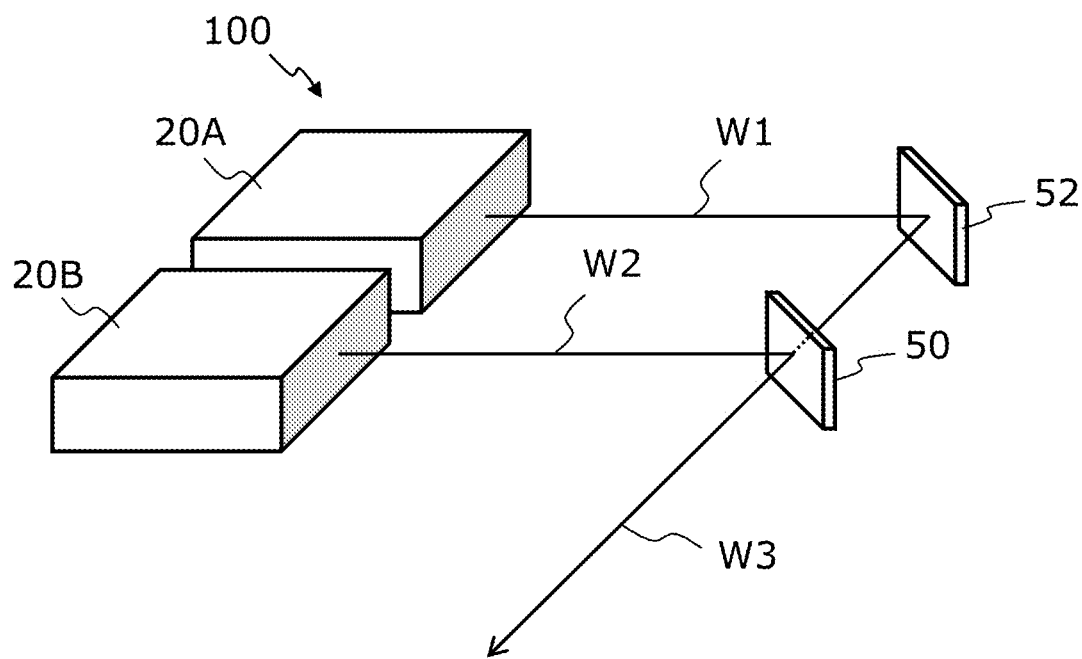
FIG. 10A is a perspective view schematically showing an example of spatial positioning between a first light source 20A, a second light source 20B, a mirror 52, and a wavelength filter 50.
Figure 10B:
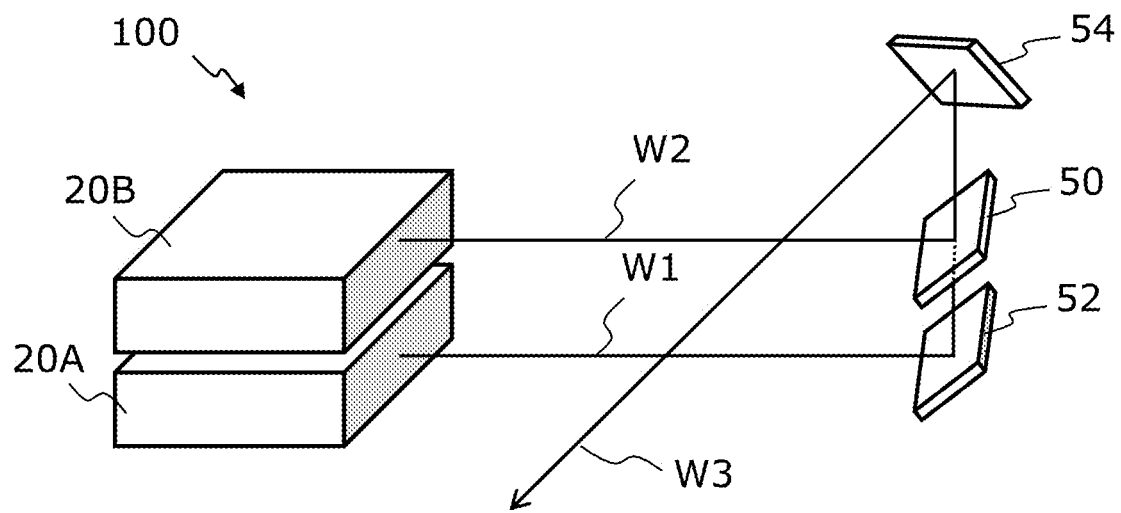
FIG. 10B is a perspective view schematically showing another example of spatial positioning between a first light source 20A, a second light source 20B, a mirror 52, and a wavelength filter 50.

FIGS. 10A and 10B are perspective views schematically showing examples of spatial positioning between the first light source 20A, the second light source 20B, the mirror 52, and the wavelength filter 50. In the example of FIG. 10A, the first light source 20A and the second light source 20B are arranged along the horizontal direction. On the other hand, in the example of FIG. 10B, the first light source 20A and the second light source 20B are arranged along the vertical direction, and the light source device 100 further includes a mirror 54 that causes the third wavelength-combined beam W3 having been reflected by the mirror 52 and the wavelength filter 50 in the upward direction to be reflected in the horizontal direction. The number and arrangement of the mirrors are not limited to what is illustrated in these figures.

Although the examples of FIG. 10A and FIG. 10B illustrate that the light source device 100 includes two light sources 20A and 20B, three or more light sources can be included in the light source device 100. The structure shown in FIG. 10C includes a first light source 20A, a second light source 20B, and a third light source 20C. The light sources 20A, 20B and 20C respectively emit a wavelength-combined beam RW having a wavelength in a first wavelength range, a wavelength-combined beam GW having a wavelength in a second wavelength range, and a wavelength-combined beam BW having a wavelength in a third wavelength range. Herein, the second wavelength range defines a range of wavelengths shorter than the wavelengths in the first wavelength range, and third wavelength range defines a range of wavelengths shorter than the wavelengths in the second wavelength range.

Figure 10C:
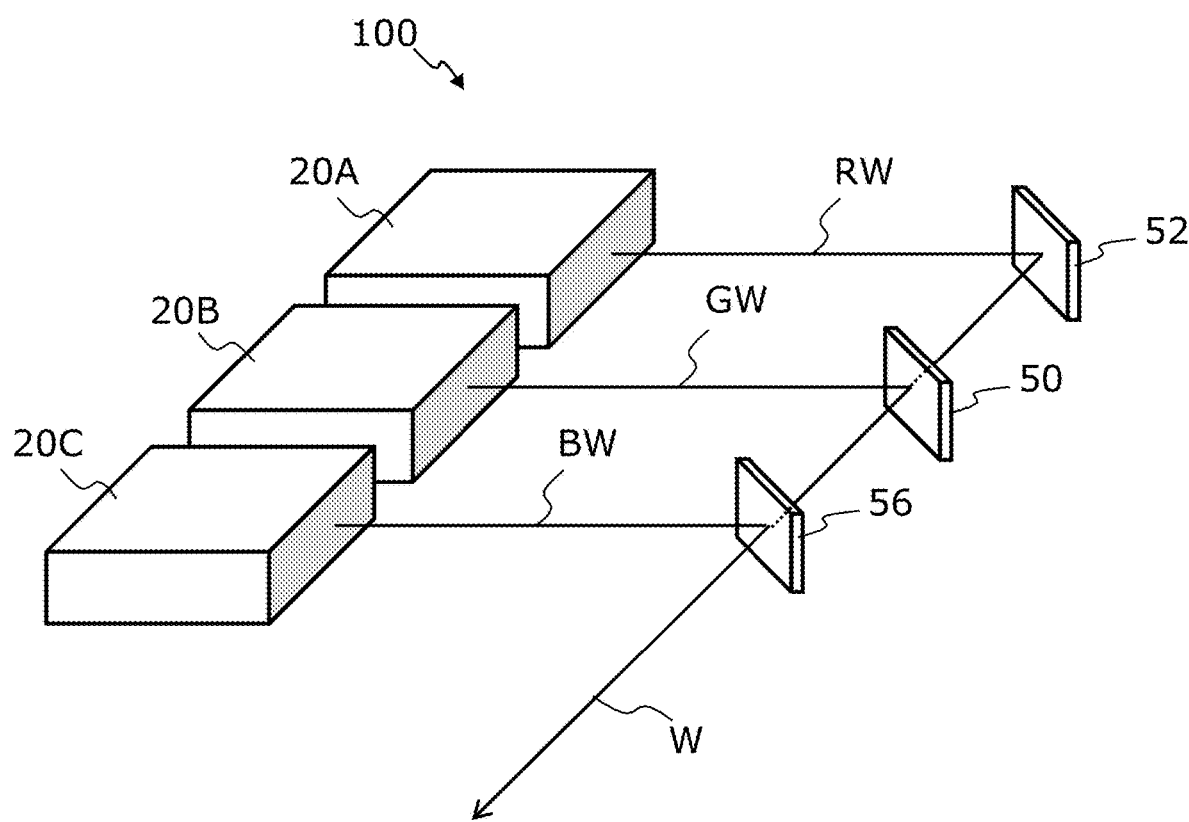
FIG. 10C is a perspective view schematically showing an example of spatial positioning between a first light source 20A, a second light source 20B, and a third light source 20C, a mirror 52, and wavelength filters 50 and 56.

The light source device 100 in FIG. 10C includes a wavelength filter 56 configured to transmit the wavelength-combined beam RW having a wavelength in the first wavelength range and the wavelength-combined beam GW having a wavelength in the second wavelength range and to reflect the wavelength-combined beam BW having a wavelength in the third wavelength range. In this example, the first optical path length Od1 is the distance from the first light source 20A to the wavelength filter 56, through which the wavelength-combined beam W including all laser beams is emitted. Similarly, the second optical path length Od2 is the distance from the second light source 20B to the wavelength filter 56. The third optical path length Od3 is the distance from the third light source 20C to the wavelength filter 56. In this example, Od1>Od2>Od3 holds true. Note that the first wavelength range, the second wavelength range, and the third wavelength range can respectively be a wavelength range corresponding to red color, a wavelength range corresponding to green color, and a wavelength range corresponding to blue color. In that case, the wavelength-combined beam W in FIG. 10C corresponds to "white light".

<Light Source Device>

Figure 11:
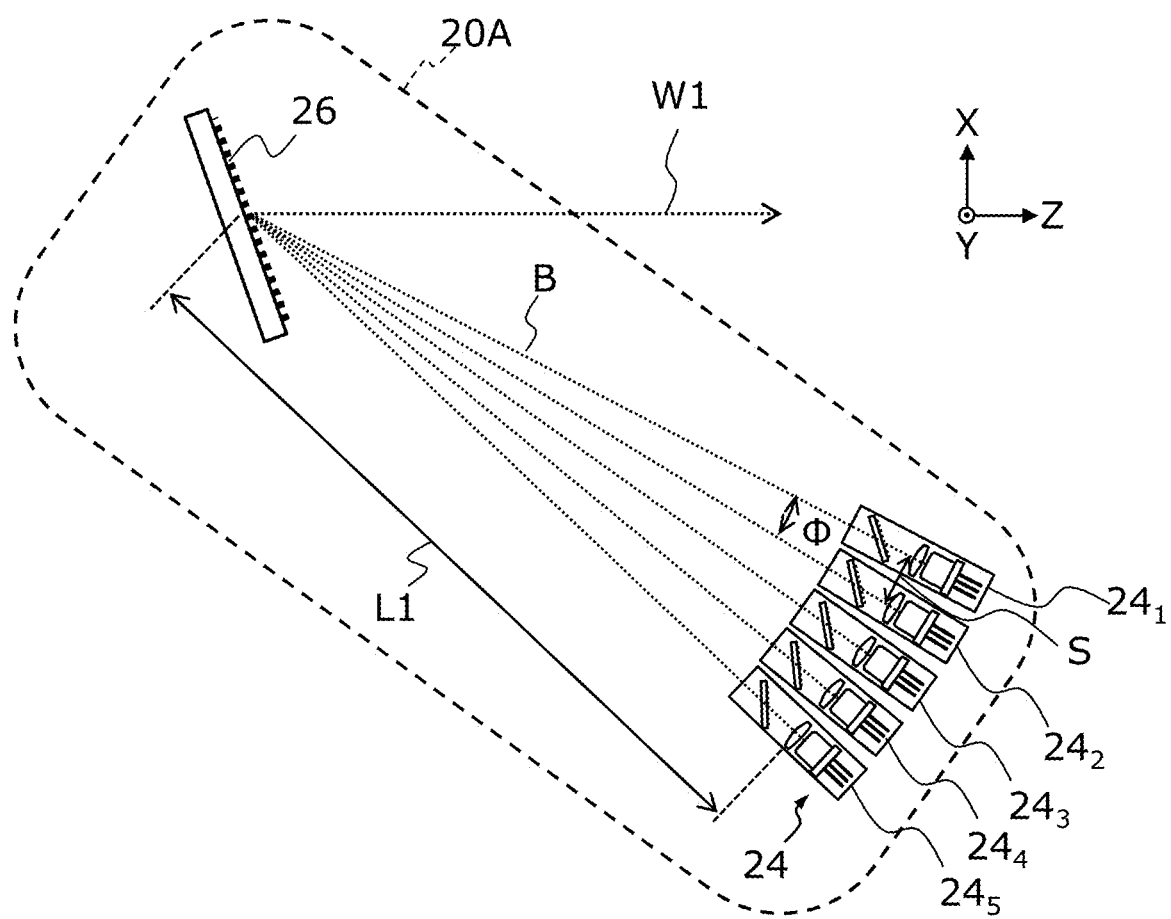
FIG. 11 is a cross-sectional view schematically showing an example structure of the first light source according to an embodiment of the present disclosure.

FIG. 11 is a diagram showing an example structure of a first light source 20A according to the present embodiment. The first light source 20A coaxially combines a plurality of laser beams B of different peak wavelengths $\lambda$ to generate and emit a wavelength-combined beam W1. The second light source 20B is basically similar in structure to the first light source 20A. A difference lies in the magnitude of the wavelength $\lambda$ of the laser beam B. Therefore, the structure of the second light source 20B will not be redundantly described.

As shown in FIG. 11, the first light source 20A includes a plurality of laser modules 24 that respectively emit the plurality of laser beams B; and a beam combiner 26 that combines the plurality of laser beams B to generate the wavelength-combined beam W1. The laser modules 24 according to the present embodiment are of an external cavity type. For simplicity, FIG. 11 illustrates five laser modules $24_1$ to $24_5$. From the laser modules $24_1$ to $24_5$, laser beams B of peak wavelengths $\lambda_1$ to $\lambda_5$ are emitted. Although the relationship $\lambda_1<\lambda_2<\lambda_3<\lambda_4<\lambda_5$ holds true here, this does not have to be satisfied. The number of laser modules 24 in the first light source 20A may be other than five; there may be six or more (e.g., ten or more) laser modules 24 in the first light source 20A.

In the present embodiment, the peak wavelengths of adjacent laser beams B differ by $\delta\lambda$ ($\lambda_{n+1}-\lambda_n=\delta\lambda$), and the angle $\Phi$ between adjacent laser beams B is about 0.4 degrees, i.e., about 7 milliradians (mrad). Moreover, the arrangement pitch S between the laser modules 24 is about 10 mm. In the case in which such exemplary values are adopted, from the approximate expression $\Phi \times L1=S$, the distance L1 is determined to be about 1500 mm. In order to efficiently accommodate component elements in a limited space, one or more mirrors can be inserted between the laser module(s) 24 and the beam combiner 26, and the propagation direction of each laser beam B can be rotated using such a mirror.

Figure 12:
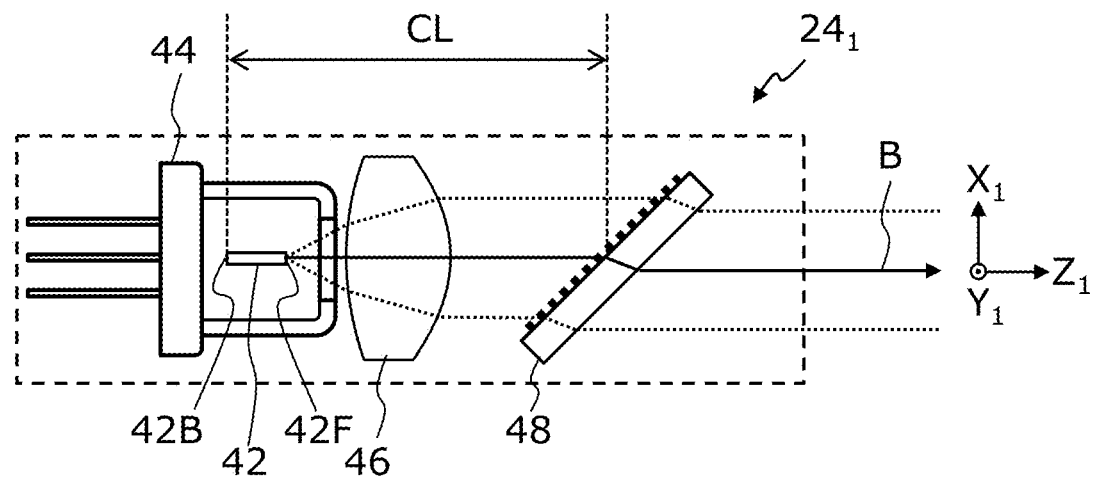
FIG. 12 is a cross-sectional view showing an example structure of an external cavity laser module 24 used in the present embodiment.
Figure 13:
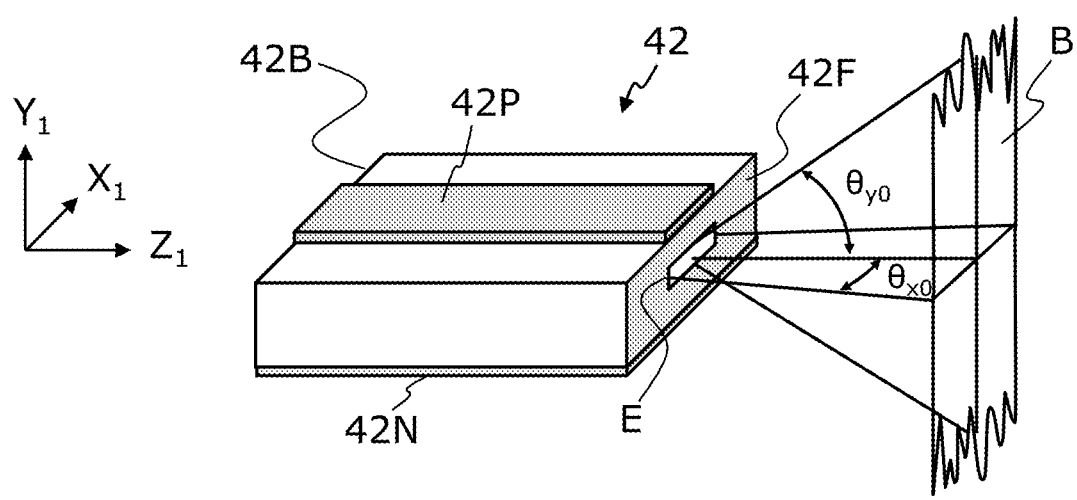
FIG. 13 is a perspective view showing an example of a basic structure of an LD 42.

Next, with reference to FIG. 12 and FIG. 13, a specific example of the structure of the external cavity laser modules 24 will be described. FIG. 12 is a cross-sectional view showing one example of the structure of the external cavity laser module $24_1$. The other external cavity laser modules $24_2$ to $24_5$ also respectively have a structure the same as or a similar to that of the external cavity laser module $24_1$. For reference, an $X_1Y_1Z_1$ coordinate system that is based on an $X_1$ axis, a $Y_1$ axis, and a $Z_1$ axis that are orthogonal to one another is schematically shown in FIG. 12 and FIG. 13. This $X_1Y_1Z_1$ coordinate system defines local coordinates that are assigned to the laser module $24_1$. Although it is convenient that the origin of the $X_1Y_1Z_1$ coordinate system is illustrated at a position that coincides with the origin of the laser beam B in the laser module $24i$, the origin of the $X_1Y_1Z_1$ coordinate system is depicted at a location spaced apart from the emitter for ease of illustration. The $Z_1$ axis is parallel to the propagation direction (i.e., beam center axis) of the laser beam B.

The external cavity laser module $24_1$ in FIG. 12 has an external cavity structure that includes an LD 42 as a light source or an optical gain element (i.e., gain medium).

In general, if an LD 42 emitting a laser beam of a wavelength that is shorter than the near-infrared region is employed and its optical output power is increased, dust or the like in the ambient may be adhered to the emitter region during operation owing to the optical dust collection effect. Other substances may also be adhered to the emitter region, which may be a deposit that is generated by a chemical reaction of volatilized organic matter with the laser beam. The shorter the wavelength of the laser beam is and the higher the optical output power is, the greater the deterioration associated with adhered matter is. When the plurality of LDs 42 are accommodated in a housing of the light source device 100, the housing may be assembled such that dust does not enter the housing, and the housing may be sealed. However, there may be cases where dust or the like adheres to the lens-like element, diffraction gratings, or other parts that are necessary for wavelength beam combining, and also it is difficult to enhance airtightness of the entire housing. This similarly applies to embodiments of the present disclosure, but the LD 42 may be mounted in a semiconductor laser package (hereinafter simply referred to as a "package") 44 that is sealed airtight, whereby a decrease in the optical output power due to dust or other influences can be suppressed. The package 44 includes a stem having a lead terminal and a metal cap covering the LD 42 that has been fixed to the stem, with a light-transmitting window member being attached to the metal cap. Any appropriate structure can be employed for the package 44, and for example, the package 44 can be a TO-CAN type package of e.g., 05.6 mm or 09 mm. An example of the window member is a thin plate formed of optical glass (refractive index: 1.4 or more). The inside of the package 44 is filled with an inert gas, e.g., a nitrogen gas of high cleanliness or a noble gas, and the package 44 may be sealed airtight. Thus, accommodating each individual LD 42 in an airtightly sealed semiconductor laser package can realize highly reliable operation over long periods of time.

For the LD 42, for example, a semiconductor laser element configured to emit laser light of near-ultraviolet, violet, blue, or green and made of a nitride semiconductor-based material can be used. The LD 42 can be secured to the stem via a submount having a high thermal conductivity. The LD 42 can be oriented in directions other than the example shown in the drawings, and the LD 42 can be oriented such that laser light therefrom is reflected along the Z axis direction by a mirror in the package 44.

FIG. 13 is a perspective view schematically showing an example of a basic structure of the LD 42. The structure shown in FIG. 13 is simplified for explanation. In the example of FIG. 13, the LD 42 includes a stripe-shaped p-electrode 42P that is formed on an upper surface, an n-electrode 42N that is formed on a lower surface, and an emitter region E that is located on an end surface 42F. The laser beam B is emitted from the emitter region E. The LD 42 includes a semiconductor substrate and a plurality of semiconductor layers (a semiconductor multilayer structure) that are grown on the semiconductor substrate. The semiconductor multilayer structure includes an emission layer, and can have various known structures. In this example, the emitter region E has a size along the X axis direction, that is, an X-axis size, (e.g. about 15 µm) much larger than a size of the emitter region E along the Y axis direction, that is, a Y-axis size (e.g. about 1.5 µm). The Y-axis size of the emitter region E is defined by the semiconductor multilayer structure (more specifically, thicknesses of the waveguide and the cladding layers, refractive index ratio, etc.) of the LD 42. The X-axis size of the emitter region E is defined by the X-axis size of a region in which an electric current flows in a direction crossing the emission layer, or specifically, by the width (gain waveguide width) of a ridge structure (not shown) and so on.

The end surface 42F of the LD 42 according to the present embodiment is provided with an antireflection film. The other end surface 42B of the LD 42 is provided with a high-reflectance film. Accordingly, the region that is indicated by a distance CL in FIG. 12 forms a cavity, the distance CL defining the cavity length. As will be described below, a portion of the laser beam B that is emitted from the LD 42 is diffracted by a transmission diffraction grating 48 so as to return to the LD 42. A standing wave of a single longitudinal mode having a predetermined wavelength is generated between the high-reflectance film on the end surface 42B of the LD 42 and the transmission diffraction grating 48. A portion of the cavity that is located outside the LD 42 is referred to as an "external cavity". The illustrated configuration is a Littrow configuration. A Littrow configuration does not need a mirror, which would be required in a Littman configuration (not shown). With a Littrow configuration having the transmission diffraction grating 48, the cavity length CL can be reduced, and it is easier to stabilize the resonance mode. In the present embodiment, the cavity length CL is in a range of 25 mm to 35 mm, for example.

As shown in FIG. 13, the beam shape of the laser beam B that is emitted from the emitter region E is asymmetric between the X axis direction and the Y axis direction. A far field pattern of the laser beam B is schematically shown in FIG. 13. The laser beam B has a beam shape that approximates a single-mode Gaussian beam along the Y axis direction, and has a multi-mode beam shape with a small divergence angle as a whole along the X axis direction. The divergence half angle $\theta_{y0}$ along the Y axis direction is greater than the divergence half angle $\theta_{x0}$ along the X axis direction.

In the Y axis direction, the laser beam B can be approximated as a Gaussian beam. Therefore, given a beam radius $\omega_o$ at the beam waist along the Y axis direction, and given a wavelength $\lambda$ of the laser beam B, then $\theta_{y0}=\tan^{-1}(\lambda/\pi\omega_o) \approx \lambda/(\pi\omega_o)$ radians holds true. In the case where A is in the visible light region, $\theta_{y0}$ may be e.g. 20 degrees, and $\theta_{x0}$ may be e.g. 5 degrees. Accordingly, the Y-axis size of the laser beam B increases, while relatively "rapidly" diverging, during propagation along the Z axis direction. Thus, the Y axis is called "the fast axis", and the X axis "the slow axis". Because the laser beam B has a multi-mode beam shape along the slow-axis direction, the beam quality along the slow-axis direction is reduced relative to the beam quality along the fast-axis direction. Accordingly, the Beam Parameter Product (BPP) indicating beam quality is relatively larger along the slow-axis direction, relative to that along the fast-axis direction. BPP is a multiplication of the beam waist radius by the divergence half angle in a far field. BPP is an index for quantitatively assessing beam quality. The more the beam quality is deteriorated, the greater the value of BPP is.

As used in the present disclosure, the terms "fast axis direction" and "slow axis direction", when referring to each individual LD 42, respectively refers to a $Y_1$ axis and an $X_1$ axis in an $X_1Y_1Z_1$ coordinate system for each LD 42. When referring to the wavelength-combined beam W, the terms "fast axis direction" and "slow axis direction" respectively refers to "the Y axis direction" and "the X axis direction" in the global XYZ coordinate system. In other words, in a cross section that is orthogonal to the propagation direction of a laser beam, the direction along which BPP is the lowest refers to "the fast axis", and the direction that is orthogonal to the fast axis refers to "the slow axis".

FIG. 12 is referred to again. The illustrated laser module $24_1$ includes a collimator lens 46 configured to collimate a laser beam B that is emitted from the LD 42. The collimator lens 46 is a spherical lens, for example. In the form of a bundle of substantially parallel rays, the laser beam B that has been transmitted through the collimator lens 46 is incident on the transmission diffraction grating 48.

Figure 14A:
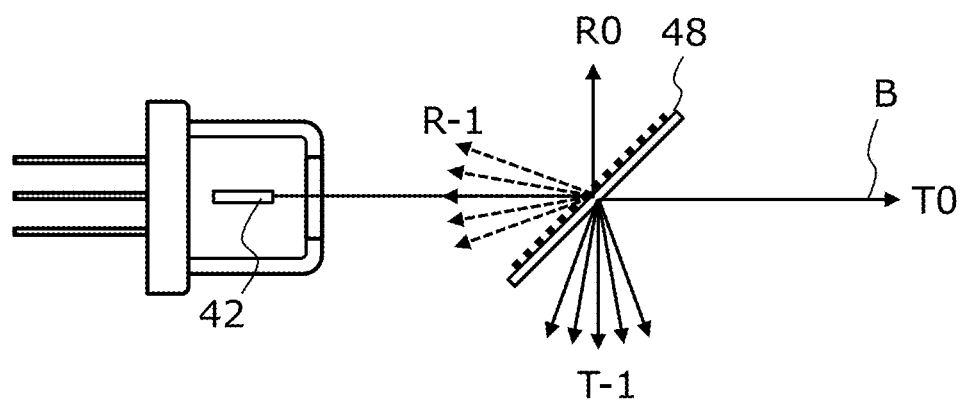
FIG. 14A is a cross-sectional view schematically showing the action of a transmission diffraction grating 48.
Figure 14B:
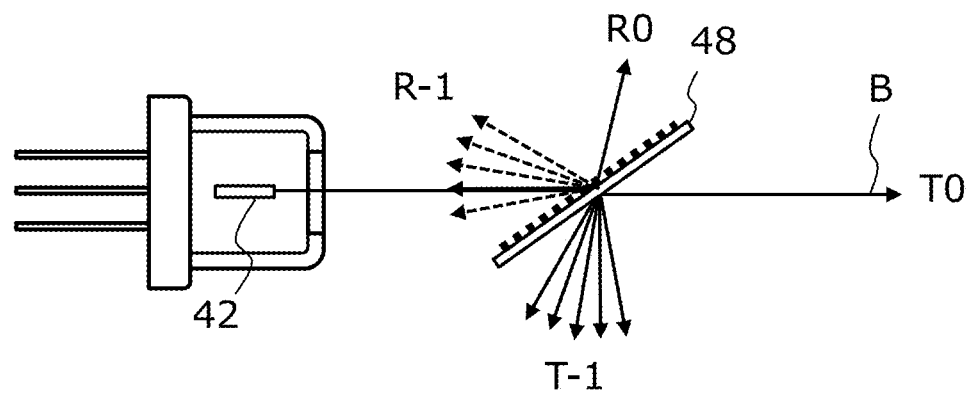
FIG. 14B is another cross-sectional view schematically showing the action of the transmission diffraction grating 48.

Each of FIG. 14A and FIG. 14B is a cross-sectional view schematically showing diffraction of the laser beam B by the transmission diffraction grating 48. A difference between FIG. 14A and FIG. 14B is the tilt angle of the transmission diffraction grating 48. In these figures, for simplicity, illustration of the collimator lens 46 is omitted, and the laser beam B and the diffracted light are also represented as straight lines.

A laser beam is incident on the transmission diffraction grating 48 in the example in these drawings to provide, mainly, $0^{th}$ order transmission-diffracted light T0, $0^{th}$ order reflection-diffracted light R0, $-1^{st}$ order transmission-diffracted light T–1, and $-1^{st}$ order reflection-diffracted light R–1. The $-1^{st}$ order diffracted light T–1 and R–1 are emitted from the transmission diffraction grating 48 at different angles in accordance with their wavelengths. Of these diffracted light beams, it is the $-1^{st}$ order reflection-diffracted light R–1 that returns to the LD 42. In the case in which the Littman configuration described above is employed, the $-1^{st}$ order reflection-diffracted light R–1 will be reflected by a mirror not shown, and thereafter return to the LD 42 again through the transmission diffraction grating 48. Therefore, a Littman configuration can increase the cavity length, thus reducing the stability of the longitudinal mode.

In FIG. 14A and FIG. 14B five rays are schematically shown for each of $-1^{st}$ order diffracted light T–1 and R–1. These five rays are five imaginary $-1^{st}$ order diffracted rays of mutually different wavelengths. In actuality, a single standing wave of the longitudinal mode will be created within a cavity in which laser oscillation occurs, and only the diffracted ray(s) that has the wavelength of this standing wave will return to the LD 42 so as to contribute to laser oscillation. In the case in which the tilt angle of the transmission diffraction grating 48 changes, the wavelength of the $-1^{st}$ order reflection-diffracted light R–1 to return to the LD 42 is shifted. Adjustment the tilt angle of the transmission diffraction grating 48 allows selection the wavelength of laser oscillation. Even in the case in which the tilt angle of the transmission diffraction grating 48 is constant, similar effects can be obtained by adjusting the grating pitch of the transmission diffraction grating 48.

In one example, the transmission diffraction grating 48 can be configured so that, within a beam of a predetermined wavelength (e.g. about 410 nm) that is incident at a predetermined angle (40 to 50 degrees), the $0^{th}$ order transmission-diffracted light T0 accounts for e.g. about 50% or more, that the $-1^{st}$ order reflection-diffracted light R–1 accounts for e.g. about 25%, and that a total of the $0^{th}$ order reflection-diffracted light R0 and the $-1^{st}$ order transmission-diffracted light T–1 accounts for e.g. about 25% or less.

Figure 15:
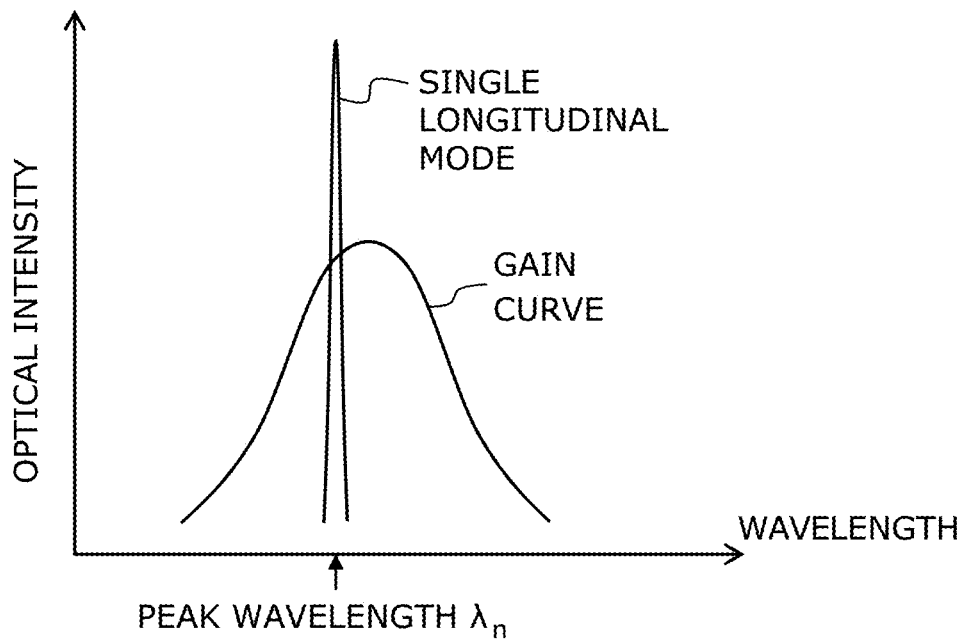
FIG. 15 is a diagram schematically showing a gain curve of the LD 42 and a spectrum of a laser beam B that is emitted from an external cavity laser module 24 that is lasing in a single longitudinal mode at a certain wavelength $\lambda_n$.

FIG. 15 is a diagram schematically showing a gain curve (i.e., a curve representing wavelength dependence of gain) of the LD 42 and a spectrum of a laser beam B that is emitted from an external cavity laser module 24 that is lasing in a single longitudinal mode at a certain wavelength $\lambda_n$. The wavelength (peak wavelength $\lambda_n$) of the laser beam B is selected from a wavelength range with a gain that allows laser oscillation. With the external cavity structure, the laser beam B has a narrow spectral width, presenting a sharp peak.

According to one embodiment of the present disclosure, a plurality of LDs 42 are provided that are configured to have gains that allow laser oscillation in a wavelength range that includes, e.g., a range of 400 nm to 420 nm. In other words, a plurality of LDs 42 each having a gain spectral width of about 20 nm, such that the largest gain is obtained at a wavelength of 410 nm, are provided. Then, the structure and tilt angle of the transmission diffraction grating 48 are adjusted so that the rays of $-1^{st}$ order reflection-diffracted light R–1 returning from the transmission diffraction grating 48 to the respective LDs 42 will have wavelengths differing from each other by several nm. Using the external cavity laser modules 24 allows the laser beams to have a narrow spectral width, and lasing wavelengths of the laser beams to be stable. As a result, by using the beam combiner 26, e.g. a diffraction grating, a plurality of laser beams can be coaxially combined in a desired direction, with a high precision.

The plurality of laser beams B of different peak wavelengths $\lambda_n$ thus obtained are coaxially combined through wavelength beam combining, to create the wavelength-combined beam. LDs 42 of an identical gain spectral width (e.g. a wavelength range from 20 nm to 30 nm) generally have semiconductor multilayer structures that are formed of a semiconductor of an identical composition. In embodiments of the present disclosure, other appropriate configurations can also be employed. For example, the LDs 42 can include a laser diode(s) including a light emission layer with a semiconductor composition different from that of other laser diode(s) of LDs 42, such that its gain spectral range is not the same. More specifically, for example, a plurality of laser beams B having peak wavelengths in at least one of the color ranges of ultraviolet, violet, blue, and green can be combined in any appropriate manner, so that a wavelength-combined beam W of various spectra can be created.

Figure 16:
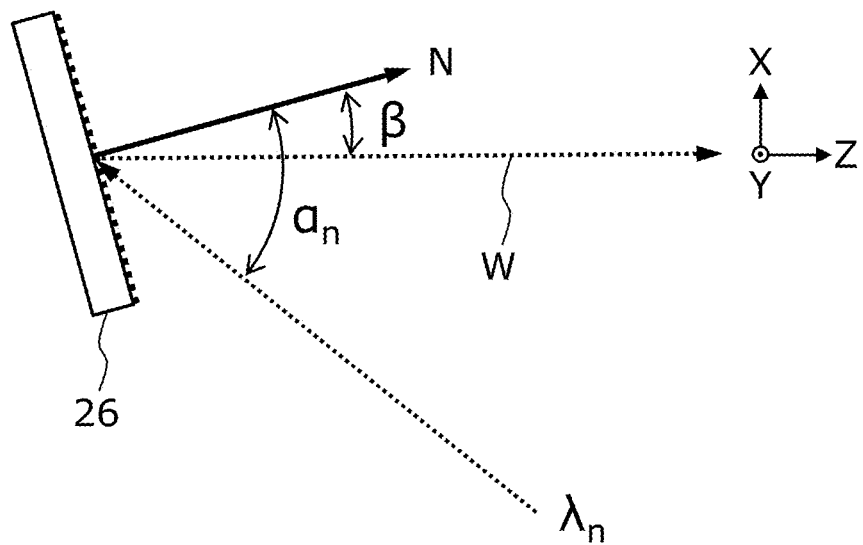
FIG. 16 is a diagram showing the action of a reflection-type diffraction grating that is included in a beam light source 20 and serves as a beam combiner 26 according to the present embodiment.

FIG. 16 is a diagram showing the action of a reflection-type diffraction grating that is included in the beam light source 20 and serves as the beam combiner 26 according to the present embodiment. A laser beam B of a peak wavelength $\lambda_n$ is incident on the beam combiner 26 at an incident angle $\alpha_n$ relative to the normal direction N of the beam combiner 26. The $-1^{st}$ order reflection-diffracted light is incident in the Z axis direction, at a diffraction angle $\beta$. In this case, the equation $\sin \alpha_n + \sin \beta = K \cdot m \cdot \lambda_n$ holds true. Herein, K is the number of diffraction gratings per millimeter of the beam combiner 26, and m is the number of diffraction order.

Thus, with the first light source 20A in the present embodiment, laser beams B of mutually different peak wavelengths $\lambda_n$ are emitted from external cavity laser modules 24, and are incident on the beam combiner 26 at appropriate incident angles $\alpha_n$. Accordingly, laser beams B that are diffracted by an identical diffraction angle $\beta$ are spatially overlapped, whereby wavelength beam combining is achieved. As a result, the first wavelength-combined beam W1, travelling in the direction defined by the diffraction angle $\beta$, is obtained.

In one example, eleven external cavity laser modules 24 that were adapted to emit laser beams having peak wavelengths $\lambda_n$ in the first wavelength range of 430 nm to 450 nm are provided, these external cavity laser modules 24 being aligned so as to realize incident angles $\alpha_n$ and an identical diffraction angle $\beta$. In this example, the incident angles $\alpha_n$ fit in the range of e.g. 43° to 47°. In the resultant first light source 20A, eleven laser beams of different peak wavelengths, all emitted at the same diffraction angle $\beta$, from the beam combiner (reflection-type diffraction grating) 26, are coaxially combined to generate a single wavelength-combined beam.

In such an example, LDs 42 having gain at wavelengths in the range of 430 nm to 450 nm (i.e., the first wavelength range in this example) are used. In other words, the gain spectral width $\Delta\lambda$ is about 20 nm. There exists a wavelength difference $\delta\lambda$ of about 2.0 nm between the peak wavelength $\lambda_n$ of a laser beam that is emitted from an $n^{th}$ laser module $24_n$ and the peak wavelength $\lambda_{n+1}$ of a laser beam that is emitted from an n+1$^{th}$ laser module $24_{n+1}$. Moreover, there exists an angle difference of about 4 degrees between the incident angle $\alpha_n$ of a laser beam that is emitted from an $n^{th}$ laser module $24_n$ and the incident angle $\alpha_{n+1}$ of a laser beam that is emitted from an n+1$^{th}$ laser module $24_{n+1}$.

The second light source 20B has a basic structure similar to that of the first light source 20A, except that LDs 42 having gain in the range of e.g. about 400 nm to 420 nm (i.e., the second wavelength range in this example) are used. Accordingly, eleven laser beams having peak wavelengths differing by e.g. about 2 nm within the second wavelength range are coaxially combined, whereby a second wavelength-combined beam W2 is obtained.

In the case in which the external cavity laser modules 24 in the first light source 20A are to be referred to as the "first external cavity laser modules", and the beam combiner 26 as the "first beam combiner", the external cavity laser modules 24 in the second light source 20B can be referred to as the "second external cavity laser modules", and the beam combiner 26 as the "second beam combiner".

Any appropriate configurations other than those described in the example above can be employed in embodiments according to the present disclosure. By using a plurality of LDs having a gain spectral width of e.g. several tens of nanometers selected from a wavelength range of e.g. 350 nm to 550 nm, wavelength beam combining can be achieved in various wavelength bands. In a wavelength range of 350 nm to 550 nm, metals such as copper has a high absorptance, and accordingly, a wavelength-combined beam that is suitable for metal machining can be obtained. Therefore, preferably, the first wavelength range and the second wavelength range are each selected from within a range of wavelengths 350 nm to 550 nm.

The wavelength-combined beam W1 or W2 emitted from each of the first light source 20A and the second light source 20B having the structure described above has a beam quality asymmetric between the Y axis (fast axis) direction and the X axis (slow axis) direction, as described earlier. As a result, a third wavelength-combined beam that is obtained by combing the first wavelength-combined beam W1 and the second wavelength-combined beam W2 will also have a similarly asymmetric beam quality.

Figure 17A:
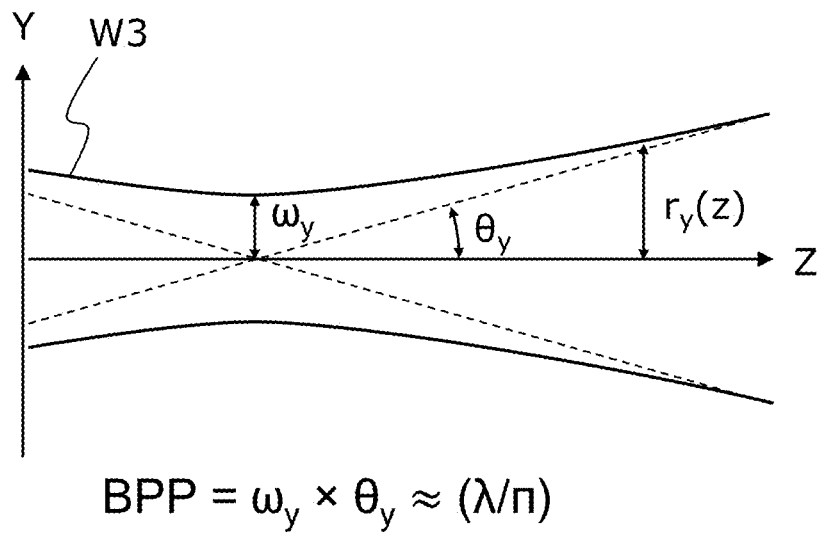
FIG. 17A is a cross-sectional view schematically showing a beam shape of a wavelength-combined beam W along the fast axis (the Y axis) direction.
Figure 17B:
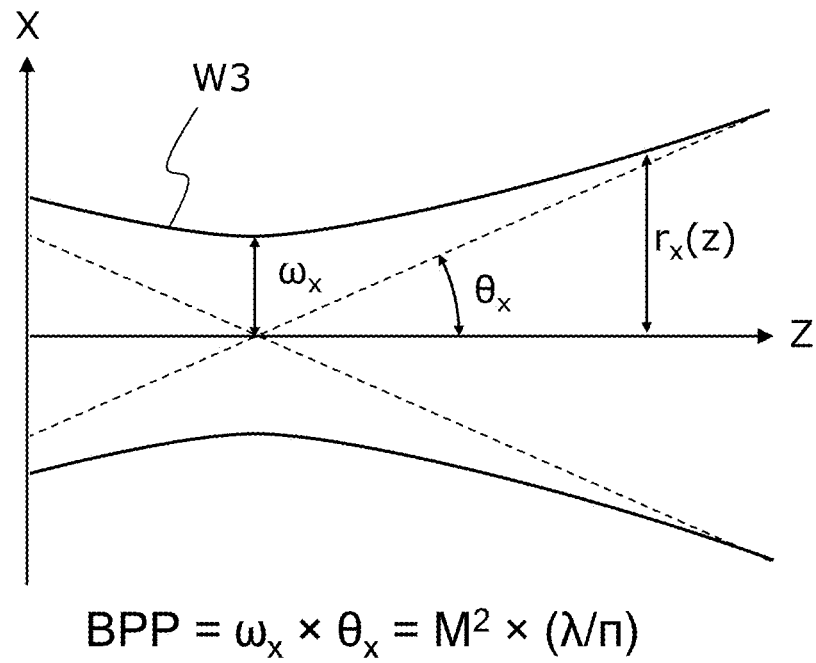
FIG. 17B is a cross-sectional view schematically showing a beam shape of a wavelength-combined beam W along the slow axis (the X axis) direction.

FIG. 17A is a cross-sectional view schematically showing a beam shape of the third wavelength-combined beam W3 along the Y axis direction. FIG. 17B is a cross-sectional view schematically showing a beam shape of the third wavelength-combined beam W3 along the X axis direction.

In the description below, the beam radius at the beam waist along the Y axis direction will be represented by $\omega_y$, and the divergence half angle in a far field will be represented by $\theta_y$. Similarly, the beam radius at the beam waist along the X axis direction will be represented by $\omega_x$, and the divergence half angle in a far field will be represented by $\theta_x$. In this case, in the Y axis direction, the third wavelength-combined beam W3 can be approximated to a Gaussian beam. Therefore, the first BPP (unit: [mm·mrad]) along the Y axis direction, i.e., $\omega_y \times \theta_y$, is substantially equal to $\lambda/\pi$. On the other hand, in the X axis direction, the third wavelength-combined beam W3 cannot be approximated as a Gaussian beam, but can still be considered as a beam whose beam radius is enlarged from that of a Gaussian beam. The second BPP along the X axis direction is expressed as $\omega_y \times \theta_y = M^2 \times (\lambda/\pi)$. In the case in which evaluating beam quality in terms of a factor $M^2$ based on the 1$^{st}$ order Gaussian beam, $M^2$ can be regarded as about 1 regarding the Y axis direction. The $M^2$ in the X axis direction may be around 11, for example.

In one example, the first BPP of the third wavelength-combined beam W3 along the Y axis (fast axis) direction is about 0.15 mm·mrad, and the second BPP along the X axis (slow axis) direction is about 1.43 mm·mrad. Thus, in the X axis direction, the beam quality of the third wavelength-combined beam W3 is relatively low, such that the beam greatly diverges in proportion to the optical path length.

While the plurality of laser modules 24 are arranged so as to be inclined at every predetermined angle in each of the first light source 20A and the second light source 20B according to the present embodiment, other appropriate configurations can be employed for the beam light sources 20 according to the present disclosure. The plurality of laser modules 24 can be arranged so as to be parallel to one another, and the laser beams B emitted from the laser modules 24 can have their propagation directions deflected by the corresponding mirrors, so as to be incident on the beam combiner 26 at different angles. Instead of using corresponding mirrors, the plurality of laser beams B propagating in parallel directions may be deflected by using a converging lens.

<Optical Coupling Device>

Figure 18:
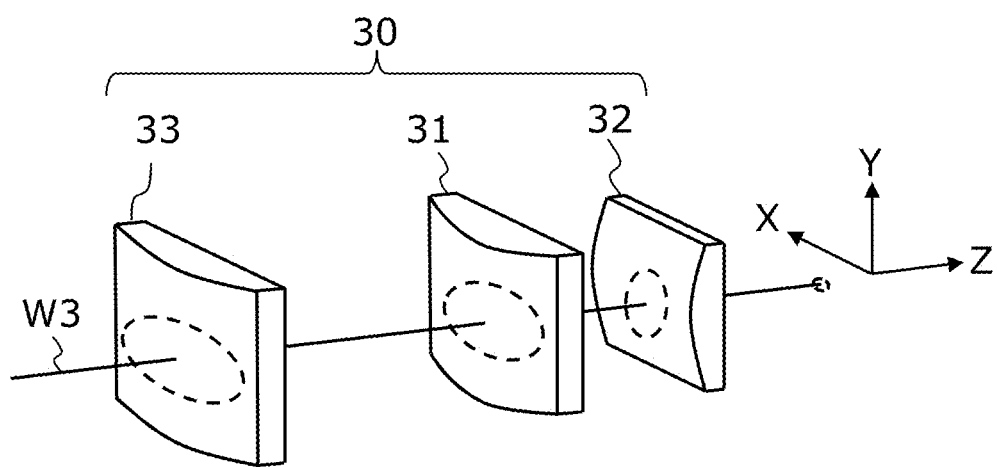
FIG. 18 is a perspective view schematically showing an example structure of the optical coupling device 30 according to the present embodiment.
Figure 19:
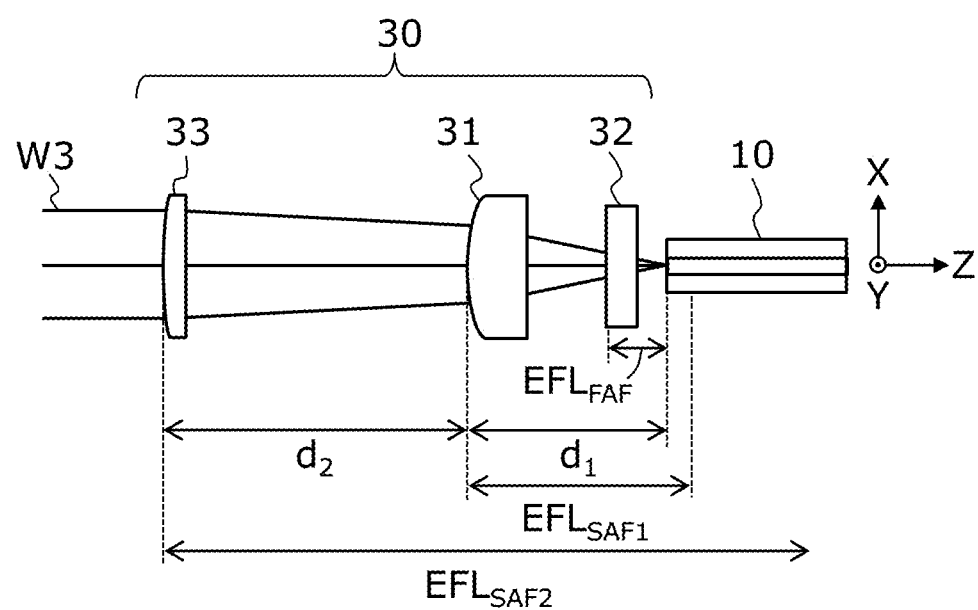
FIG. 19 is a cross-sectional view schematically showing an example structure of the optical coupling device 30 according to the present embodiment.

Hereinafter, with reference to FIG. 18 and FIG. 19, an example structure of the optical coupling device 30 included in the light source device 100 according to the present embodiment will be described. FIG. 18 is a perspective view schematically showing the example structure of the optical coupling device 30. FIG. 19 is a cross-sectional view schematically showing the example structure of the optical coupling device 30.

A first beam parameter product (first BPP) of the third wavelength-combined beam W3 along a first direction (the X axis direction), which is orthogonal to the propagation direction (the Z axis direction) of the third wavelength-combined beam W3, is greater than a second BPP of the third wavelength-combined beam W3 along a second direction (the Y axis direction), which is orthogonal to both the propagation direction and the first direction.

As shown in FIG. 18, the optical coupling device 30 includes: a first cylindrical lens 31, a second cylindrical lens 32, and a third cylindrical lens 33. The first cylindrical lens 31 focuses the third wavelength-combined beam W3 in a first plane (XZ) that includes the propagation direction and the first direction (the X axis direction). The second cylindrical lens 32 focuses the third wavelength-combined beam W3 in a second plane (YZ) that includes the propagation direction and the second direction (the Y axis direction). The third cylindrical lens (additional-converging lens) 33 that focuses the third wavelength-combined beam W3 in the first plane (XZ) so that the third wavelength-combined beam W3 is incident on the first cylindrical lens 31. The cylindrical lens has a curved surface to converge a parallel bundle of rays onto a straight line (focal point). The curved surface of the cylindrical lens has a shape corresponding to a portion of the outer peripheral surface of a circular cylinder, and the cylindrical lens has zero curvature in a direction corresponding to an axial direction of the corresponding circular cylinder. Each curve (broken line) in FIG. 18 schematically represents a beam cross-sectional shape of the each lens 31, 32, 33 on the incident surface.

As shown in FIG. 19, the first cylindrical lens 31, the second cylindrical lens 32, and the third cylindrical lens 33 respectively have a first focal length $EFL_{SAF1}$, a second focal length $EFL_{FAF}$, and a third focal length $EFL_{SAF2}$. The third focal length $EFL_{SAF2}$ is longer than the first focal length $EFL_{SAF1}$. For example, the first focal length $EFL_{SAF1}$ can be 75 mm, and the third focal length $EFL_{SAF2}$ can be 300 mm. In terms of reducing influences of spherical aberration associated with the third cylindrical lens 33, the third focal length $EFL_{SAF2}$ is preferably equal to or greater than twice the first focal length $EFL_{SAF1}$. Although the second focal length $EFL_{FAF}$ is shorter than the first focal length $EFL_{SAF1}$ in the illustrated example, other appropriate configurations can be employed for embodiments of the present disclosure.

The beam shape and beam quality of the third wavelength-combined beam W3 greatly differ between the first plane (XZ) and the second plane (YZ). In the present embodiment, focusing on the optical fiber 10 in the first plane (XZ), which is associated with a relatively large BPP, is achieved by the first and third cylindrical lenses 31 and 33. On the other hand, focusing on the optical fiber 10 in the second plane (YZ), which is associated with a relatively small BPP, is achieved by the second cylindrical lens 32 alone.

In the optical coupling device 30, the beam diameter of the third wavelength-combined beam W3 in the first plane (XZ) is reduced by the auxiliary third cylindrical lens 33, and then the third wavelength-combined beam W3 is incident on the first cylindrical lens 31. Because the spherical aberration of a lens increases in proportion to the third power of its beam diameter on the lens, reduction of the beam diameter on the first cylindrical lens 31 allows for reducing a decrease in beam quality caused by spherical aberration associated with the first cylindrical lens 31.

Moreover, with the third cylindrical lens 33 having a greater focal length ($EFL_{SAF2}$) than the focal length ($EFL_{SAF1}$) of the first cylindrical lens 31, a thin structure that is less prone to spherical aberration can be employed. Furthermore, since the wavelength-combined beam W having a relatively large beam divergence angle on the first plane (XZ) is incident on the third cylindrical lens 33 before being incident on the first cylindrical lens 31, the incident beam diameter on the third cylindrical lens 33 can be reduced into a narrow range that is even less prone to spherical aberration. Thus, while hardly allowing a decrease in beam quality due to the third cylindrical lens 33 to occur, decrease of beam quality due to the first cylindrical lens 31 can be suppressed. Accordingly, without employing an expensive aspherical lens, it is possible to reduce the focus beam diameter and enhance the efficiency of optical coupling to the optical fiber 10.

As shown in FIG. 19, provided that the distance between the position of the image-side principal point (or rear principal point) of the first cylindrical lens 31 and the incident end surface of the optical fiber 10 is referred to as d1, and the distance between the position of the image-side principal point of the third cylindrical lens 33 and the position of the image-side principal point of the first cylindrical lens 31 is referred to as d2, $d1<EFL_{SAF1}$ and $d2<EFL_{SAF2}$ hold true. In the case in which $d2<EFL_{SAF2}$ is satisfied, it can be regarded that the third cylindrical lens 33 assists in the reduction of convergence of the beam diameter on the first plane (XZ).

<Effects Resulting from Od1 being Longer than Od2>

The spectral width of the third wavelength-combined beam W3 that is generated by combining the first wavelength-combined beam W1 and the second wavelength-combined beam W2 by WBC increases to about twice as large as the spectral width of the first wavelength-combined beam W1 or about twice as large as the spectral width of the second wavelength-combined beam W2. Therefore, "chromatic aberration" of the optical coupling device 30 can be more than negligible in some cases. Also, as described above, the laser beam has a beam quality that is asymmetric between the Y axis direction and the X axis direction. Therefore, deviation may occur between the position at which the smallest beam radius along the Y axis direction exists and the position at which the smallest beam radius along the X axis direction exists. This positional deviation is "astigmatism".

Thus, in the case in which the spectral width is increased by WBC, chromatic aberration and astigmatism may together cause the beam quality to deteriorate. As a result, even with the optical coupling device 30 improved as described above, the beam cross-section near the beam waist may have the shape of an ellipse with a large ratio between major axis and minor axis.

Figure 20A:
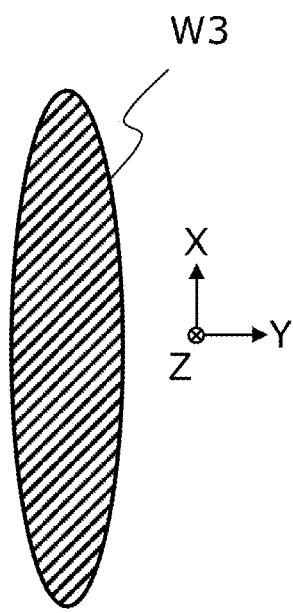
FIG. 20A is a diagram schematically showing a cross section of a third wavelength-combined beam W3 at an end surface of the optical fiber in the case where an optical path length Od1=an optical path length Od2.

FIG. 20A is a diagram showing schematically showing a cross section of the third wavelength-combined beam W3 at the end surface of the optical fiber in the case where the first optical path length Od1 between the first light source 20A and the wavelength filter 50 is equal to the second optical path length Od2 between the second light source 20B and the wavelength filter 50, i.e., Od1=Od2. In this cross section, the beam width along the X axis (slow axis) direction is larger than the beam width along the Y axis (fast axis) direction. Such an ellipse, being elongated in one direction, may not be able to be efficiently combined in an optical fiber core having a circular cross section.

Figure 20B:
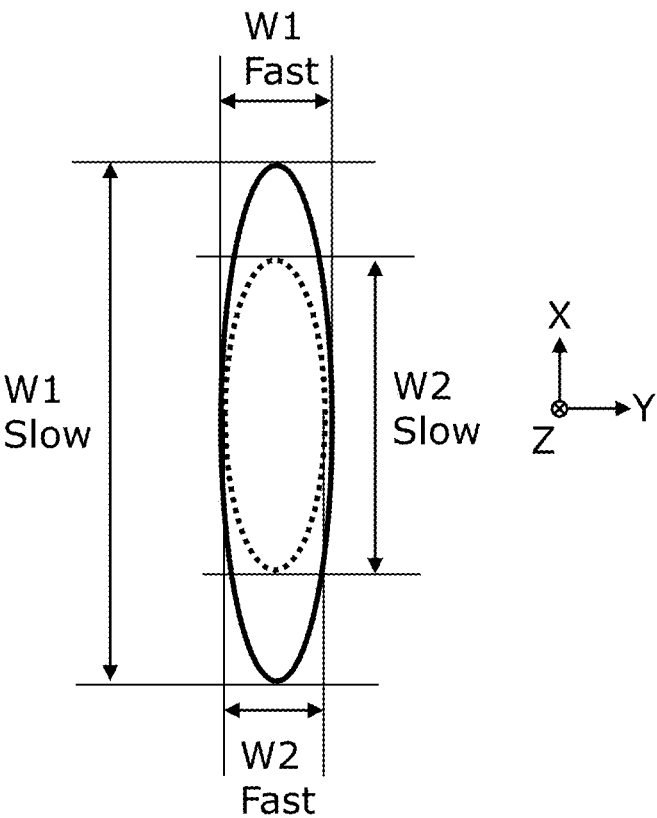
FIG. 20B is a diagram schematically showing a beam cross-section of a first wavelength-combined beam W1 and a beam cross-section of a second wavelength-combined beam W2.

The reason why the beam cross-section is elongated along the X axis direction consists in the first wavelength-combined beam W1, into which a plurality of laser beams having peak wavelengths in the first wavelength range are combined. FIG. 20B depicts, within the beam cross-section shown in FIG. 20A, a beam cross-section of the first wavelength-combined beam W1 by solid line, and a beam cross-section of the second wavelength-combined beam W2 by dotted line. In FIG. 20B, "W1 Fast" and "W1 Slow" respectively represent the beam width along the fast axis direction and the beam width along the slow axis direction of the first wavelength-combined beam W1. On the other hand, "W2 Fast" and "W2 Slow" respectively represent the beam width along the fast axis direction and the beam width along the slow axis direction of the second wavelength-combined beam W2. As can be seen from FIG. 20B, the beam quality of the first wavelength-combined beam W1 determines the beam quality of the third wavelength-combined beam W3.

Figure 20C:
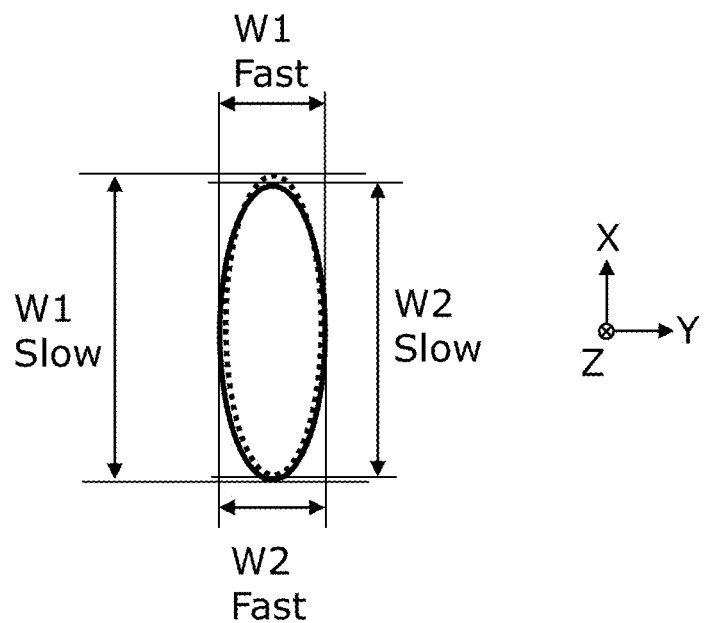
FIG. 20C is a diagram schematically showing a beam cross-section of a third wavelength-combined beam W3 at an end surface of the optical fiber in the case where an optical path length Od1>an optical path length Od2.

FIG. 20C is a diagram schematically showing a beam cross-section of the third wavelength-combined beam W3 at the end surface of the optical fiber in the case where Od1>Od2. The beam cross-section of the first wavelength-combined beam W1 has approximately the same shape and size as those of the beam cross-section of the second wavelength-combined beam W2. Thus, by satisfying the condition Od1>Od2, the beam quality of the first wavelength-combined beam W1 is improved, whereby the beam quality of the third wavelength-combined beam W3 is also improved.

Figure 21:
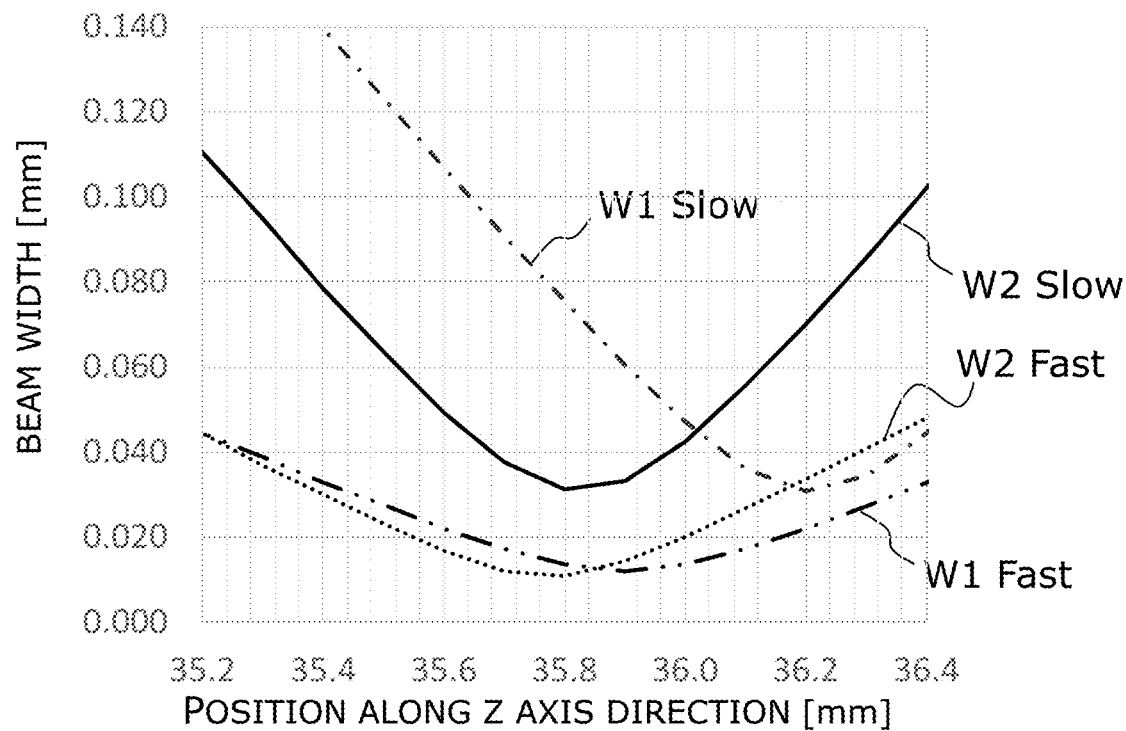
FIG. 21 is a graph showing a relationship between the beam width and the position along the Z axis direction in the case where the optical path length Od1=the optical path length Od2.

FIG. 21 is a graph showing a relationship between the beam width and the position along the Z axis direction in the case where Od1=Od2. The horizontal axis represents distance from the flat surface of the second cylindrical lens 32, and the vertical axis represents beam width. The units on the horizontal axis and the vertical axis are [mm]. In this graph, a solid line and a dotted line respectively represent the beam width (W2 Slow) along the slow axis direction and the beam width (W2 Fast) along the fast axis direction of the second wavelength-combined beam W2. A dot-dash line and a chain double-dashed line respectively represent the beam width (W1 Slow) along the slow axis direction and the beam width (W1 Fast) along the fast axis direction of the first wavelength-combined beam W1.

As can be seen from FIG. 21, the beam width along the slow axis direction (W1 Slow) of the first wavelength-combined beam W1 is more distant from the flat surface of the second cylindrical lens 32 than the beam waist position of any other beam, by 0.4 mm. As a result, in a cross section taken at the position indicated as 35.8 mm along the Z axis direction, its beam width along the slow axis direction exceeds 0.070 mm (=70 µm).

Figure 22:
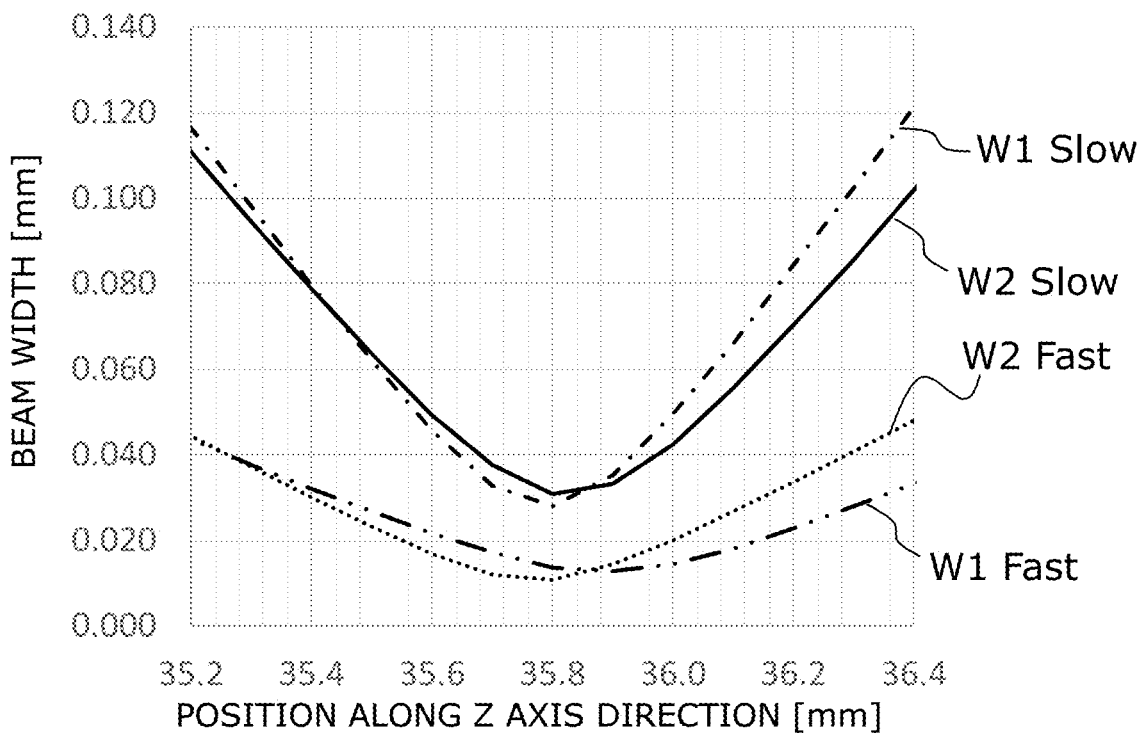
FIG. 22 is a graph showing a relationship between the beam width and the position along the Z axis direction in the case where the optical path length Od1>the optical path length Od2.

FIG. 22 is a graph showing a relationship between the beam width and the position along the Z axis direction in the case where Od1>Od2. The horizontal axis represents distance from the flat surface of the second cylindrical lens 32, and the vertical axis represents beam width. The units on the horizontal axis and the vertical axis are [mm]. The graph of FIG. 22 shows results in the case where the difference in distance (Od1−Od2) is set at 426 mm.

As is clear from FIG. 22, in this example, the beam width of each of the first wavelength-combined beam W1 and the second wavelength-combined beam W2 along the slow axis direction is reduced to about 0.036 mm (=36 µm). Accordingly, the third wavelength-combined beam W3, into which the first wavelength-combined beam W1 and the second wavelength-combined beam W2 are combined, also has a beam width of about 0.036 mm along the slow axis direction.

In an embodiment of the present disclosure, the relationship Od1>Od2 is realized by distancing the first light source 20A away from the optical coupling device 30. In the case in which the first light source 20A is distanced from the optical coupling device 30, the position of the beam waist of the first wavelength-combined beam W1 along the slow axis (Slow) direction is shifted toward the left in the graph of FIG. 22. Although one would expect that the position of the beam waist of the first wavelength-combined beam W1 along the fast axis (Fast) direction might also shift toward the left in the graph, FIG. 22 indicates that the position of the beam waist of the first wavelength-combined beam W1 along the fast axis (Fast) direction actually hardly moves. The reason for this is that, as has been described with reference to FIG. 13, the emitter region E located on the end surface 42F of the LD 42 has a relatively small size along the fast axis (Fast) direction, as compared to its size along the slow axis (Slow) direction. More specifically, the emitter region E can be regarded as a "point light source" along the fast axis (Fast) direction; therefore, the laser beam B collimated by the collimator lens 46 in FIG. 12 has a higher degree of parallelism along the fast axis (Fast) direction than along the slow axis (Slow) direction, such that the position of its beam waist hardly depends on the distance from the emitter region E to the optical coupling device 30.

The preferable size of the difference between the first optical path length Od1 and the second optical path length Od2 may vary depending on other parameters. In the case in which the first wavelength range and the second wavelength range are both in the range of 400 nm to 450 nm, the difference between the first optical path length Od1 and the second optical path length Od2 is preferably not less than 250 mm and not more than 470 mm.

<A Variation for the First and Second Light Sources>

Figure 23:
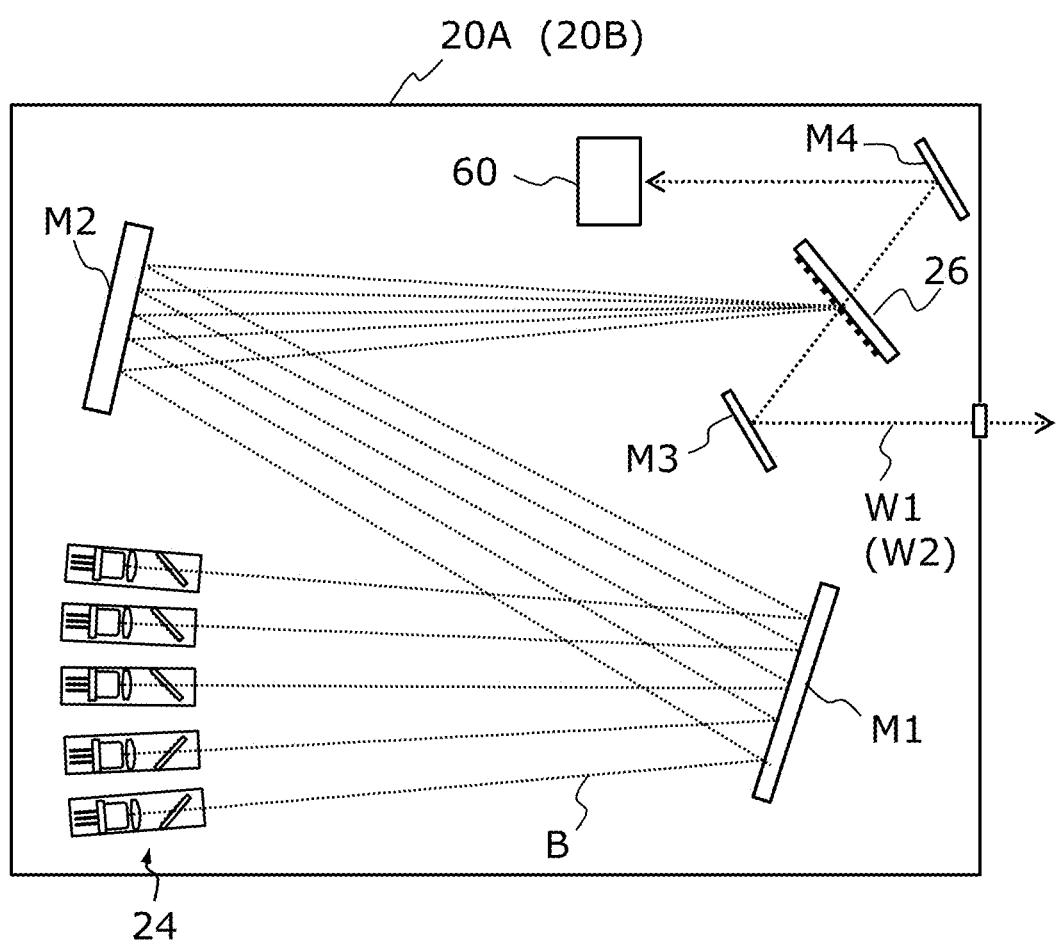
FIG. 23 is a diagram showing a variation for the first light source 20A.

FIG. 23 is a diagram showing a variation for the first light source 20A. The second light source 20B may also have a similar structure.

In the example of FIG. 23, the first light source 20A includes two mirrors M1 and M2, which change the propagation directions of the laser beams B emitted from the plurality of laser modules 24 to guide the laser beams B toward the beam combiner 26. The first light source 20A also includes mirrors M3 and M4 and a sensor 60. The mirror M3 changes the propagation direction of the first wavelength-combined beam W1 exiting from the beam combiner 26 to allow the first wavelength-combined beam W1 to exit from the first light source 20A to the outside. The mirror M4 reflects the diffracted light having been transmitted through the beam combiner 26 so as to be incident on the sensor 60. The beam quality of this diffracted light has a value in accordance with the beam quality of the first wavelength-combined beam W1. By detecting the diffracted light transmitted through the beam combiner 26 with the sensor 60, the beam quality of the first wavelength-combined beam W1 can be monitored.

In the example structure of FIG. 23, use of the mirrors M1, M2, M3 and M4 allows the first light source 20A to be downsized relative to the example structure of FIG. 11.

<Another Example Structure for the First and Second Light Sources>

Figure 24:
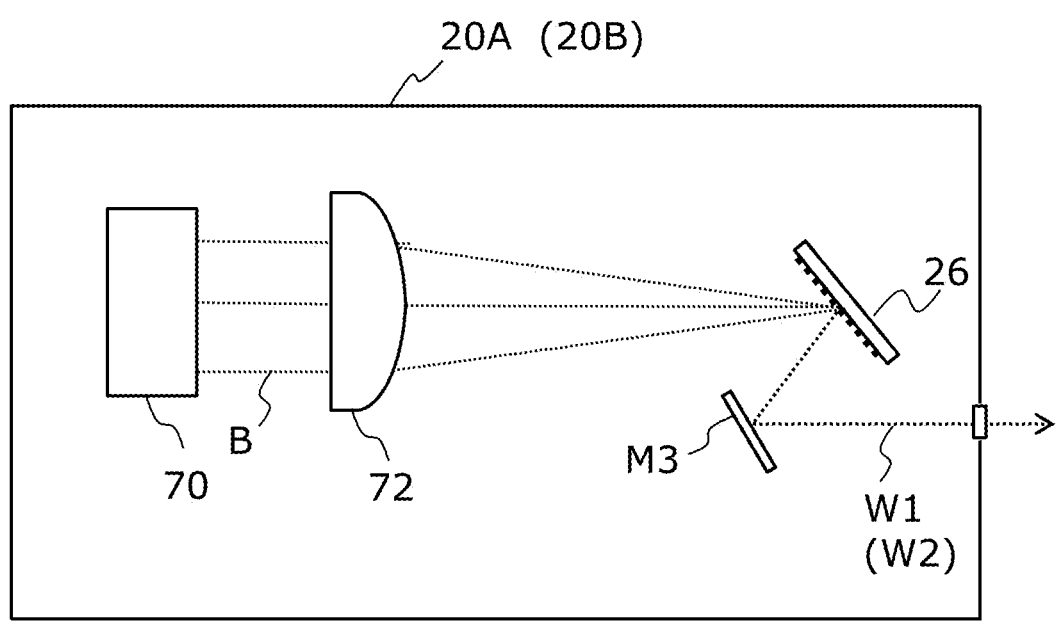
FIG. 24 is a diagram showing another example structure for the first light source 20A.

FIG. 24 is a diagram showing another example structure for the first light source 20A. The second light source 20B may also have a similar structure.

In the example of FIG. 24, the first light source 20A includes: a laser bar 70 configured to emit a plurality of laser beams B of different peak wavelengths; and a converging lens 72 configured to focus the plurality of laser beams B emitted from a laser bar 70. The laser bar 70 comprises laser diodes having a plurality of emitter regions from which the plurality of laser beams B of different peak wavelengths are emitted. The laser beams B having been focused by the converging lens 72 are incident on the beam combiner 26 at predetermined angles. The laser beams B diffracted by the beam combiner 26 are coaxially combined, and then reflected by a mirror M3 so as to exit to the outside of the first light source 20A.

For simplicity, the example of FIG. 24 illustrates that three laser beams B are emitted from a single laser bar 70; however, there may be four or more such laser beams B.

The aforementioned effects according to embodiments of the present disclosure may also be attained by using the first light source 20A and the second light source 20B shown in FIG. 24. In some embodiments of the light source device according to the present disclosure, external cavity laser modules are not indispensable component elements.

<Direct Diode Laser System>

Figure 25:
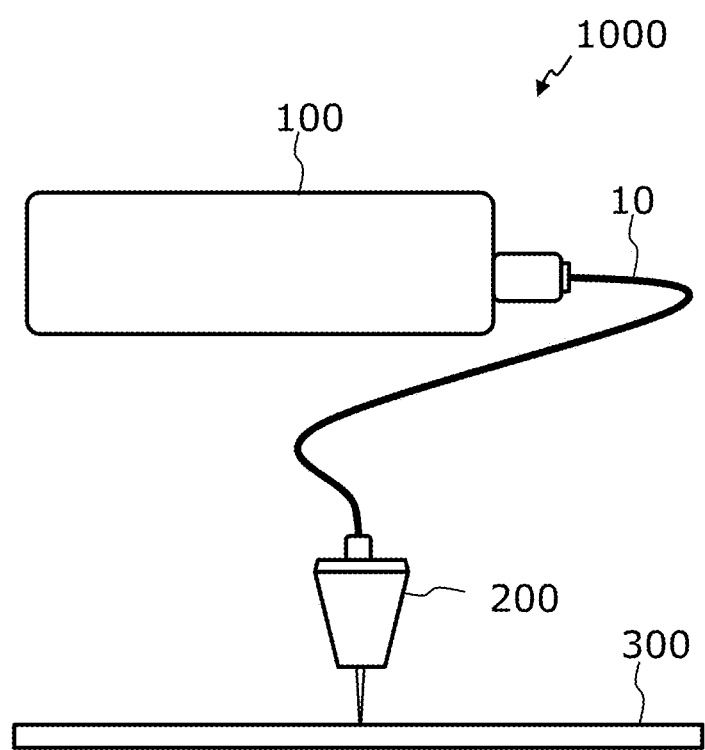
FIG. 25 is a diagram showing an example structure of a DDL system 1000 according to the present embodiment.

Next, with reference to FIG. 25, an embodiment of a DDL system according to the present disclosure will be described. FIG. 25 is a diagram showing an example structure of a DDL system 1000 according to the present embodiment.

The DDL system 1000 shown in FIG. 25 includes a light source device 100, and a processing head 200 connected to an optical fiber 10 that extends from the light source device 100. The processing head 200 irradiates a target object 300 with a wavelength-combined beam emitted from the optical fiber 10. In the example shown in FIG. 25, only one light source device 100 is mounted.

The light source device 100 has a structure similar to the above-described structure. Any appropriate number of external cavity laser modules can be mounted in the light source device 100, and the number of external cavity laser modules mounted in the light source device 100 can be determined in accordance with the optical output power or irradiance that is needed. The wavelength of the laser light to be radiated from each external cavity laser module can also be selected in accordance with the material to be processed. For example, when processing copper, brass, aluminum or the like, LDs whose oscillation wavelength is in the range of 350 nm to 550 nm may be preferably employed.

According to the present embodiment, a high-power laser beam is generated through wavelength beam combining, and is efficiently combined through an optical fiber, so that a high-fluence laser beam having high beam quality can be obtained with a high efficiency of energy conversion.

A light source device according to the present disclosure can be used for a wide range of applications where high-power and high-fluence laser light, having a high beam quality, is expected to be radiated from an optical fiber. The light source device and DDL system according to the present disclosure may be used in industrial fields where high-power laser light sources are needed, e.g., cutting or punching of various materials, localized heat treatments, surface treatments, metal welding, 3D printing, and the like.

What is claimed is:

1. A light source device comprising:
a first light source configured to generate and emit a first wavelength-combined beam, the first light source comprising:
a plurality of first external cavity laser modules configured to emit a plurality of first laser beams, respectively, each of the plurality of first laser beams having a peak wavelength within a first wavelength range, and
a first beam combiner configured to combine the plurality of first laser beams to generate the first wavelength-combined beam;
a second light source configured to generate and emit a second wavelength-combined beam, the second light source comprising:
a plurality of second external cavity laser modules configured to emit a plurality of second laser beams, respectively, each of the plurality of second laser beams having a peak wavelength within a second wavelength range that defines a range of peak wavelengths shorter than the peak wavelengths in the first wavelength range, and
a second beam combiner configured to combine the plurality of second laser beams to generate the second wavelength-combined beam; and
a wavelength filter configured to coaxially combine the first wavelength-combined beam and the second wavelength-combined beam to thereby generate and emit a third wavelength-combined beam.

2. The light source device of claim 1, wherein:
the wavelength filter is one selected from the group consisting of: a dichroic mirror, a diffractive optical element, and a holographic optical element.

3. The light source device of claim 1, wherein:
a first optical path length between the first light source and the wavelength filter is longer than a second optical path length between the second light source and the wavelength filter.

4. The light source device of claim 1, wherein:
a first optical path length is defined between the first light source and the wavelength filter,
a second optical path length is defined between the second light source and the wavelength filter, and
a difference between the first optical path length and the second optical path length is 250 mm or more.

5. The light source device of claim 1, further comprising:
a lens unit that comprises one or more lenses and is configured to focus the third wavelength-combined beam emitted from the wavelength filter.

6. The light source device of claim 1, wherein:
the peak wavelengths of respective ones of the plurality of first laser beams differ from one another within the first wavelength range; and
the peak wavelengths of respective ones of the plurality of second laser beams differ from one another within the second wavelength range.

7. The light source device of claim 1, wherein:
each of the plurality of first external cavity laser modules and each of the plurality of second external cavity laser modules includes a laser diode and an external cavity.

8. The light source device of claim 7, wherein:
a lasing wavelength of the laser diode is in a range of 350 nm to 550 nm.

9. The light source device of claim 8, wherein:
the laser diode is accommodated in a semiconductor laser package that is sealed.

10. A direct diode laser system comprising:
a light source device;
an optical fiber; and
a processing head connected to the optical fiber; wherein:
the light source device comprises:
a first light source configured to generate and emit a first wavelength-combined beam, the first light source comprising:
a plurality of first external cavity laser modules configured to emit a plurality of first laser beams, respectively, each of the plurality of first laser beams having a peak wavelength within a first wavelength range, and
a first beam combiner configured to combine the plurality of first laser beams to generate the first wavelength-combined beam,
a second light source configured to generate and emit a second wavelength-combined beam, the second light source comprising:

a plurality of second external cavity laser modules configured to emit a plurality of second laser beams, respectively, each of the plurality of second laser beams having a peak wavelength within a second wavelength range that defines a range of peak wavelengths shorter than the peak wavelengths in the first wavelength range, and a second beam combiner configured to combine the plurality of second laser beams to generate the second wavelength-combined beam, and a wavelength filter configured to coaxially combine the first wavelength-combined beam and the second wavelength-combined beam to thereby generate and emit a third wavelength-combined beam; and the third wavelength-combined beam emitted from the light source device is combined into the optical fiber; and the processing head is configured to irradiate a target object with the third wavelength-combined beam emitted from the optical fiber.

* * * * *